United States Patent
Visconti et al.

(10) Patent No.: US 9,858,367 B1
(45) Date of Patent: *Jan. 2, 2018

(54) INTEGRATED CIRCUIT INCLUDING PARAMETRIC ANALOG ELEMENTS

(75) Inventors: Antonio Visconti, Menlo Park, CA (US); David LeHoty, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/872,995

(22) Filed: Aug. 31, 2010

Related U.S. Application Data

(60) Provisional application No. 61/275,593, filed on Aug. 31, 2009.

(51) Int. Cl.
*G06F 17/50* (2006.01)
*G01R 31/28* (2006.01)

(52) U.S. Cl.
CPC ...... *G06F 17/5036* (2013.01); *G01R 31/2884* (2013.01); *G06F 17/5045* (2013.01)

(58) Field of Classification Search
CPC ............ G06F 17/5009; G06F 17/5036; G06F 17/5045; G06F 17/5068; G06F 17/5072; G06F 17/5081; G06F 11/27; G01R 31/2884
USPC .......................... 716/110, 118–119, 137–138
See application file for complete search history.

(56) References Cited

U.S. PATENT DOCUMENTS

| | | | |
|---|---|---|---|
| 5,224,055 A | 6/1993 | Grundy et al. | |
| 5,414,352 A * | 5/1995 | Tanase | 324/762.01 |
| 6,202,198 B1 | 3/2001 | Bibyk | |
| 6,442,644 B1 * | 8/2002 | Gustavson et al. | 711/105 |
| 6,556,938 B1 * | 4/2003 | Rohrbaugh et al. | 702/117 |
| 6,594,800 B2 | 7/2003 | Chang et al. | |
| 6,643,683 B1 * | 11/2003 | Drumm et al. | 709/203 |
| 6,678,877 B1 * | 1/2004 | Perry et al. | 361/720 |
| 6,931,369 B1 * | 8/2005 | Perry et al. | 703/18 |

(Continued)

OTHER PUBLICATIONS

USPTO Advisory Action for U.S. Appl. No. 12/789,991 dated Sep. 19, 2012; 3 pages.

(Continued)

*Primary Examiner* — Paul Dinh

(57) ABSTRACT

A parameterizable integrated circuit (IC) and method for designing, refining and implementing a circuit including the parameterizable IC are described. The method begins with receiving information on candidate sensing sub-circuits, parameterizable ICs and user specified requirements for the circuit including physical properties to be sensed and target values for the circuit. Each of the parameterizable ICs include a number of parametric analog and digital circuit elements, and a scheduler to schedule resources of the IC according to measurement priorities, measurement rates and the available circuit elements. Next, each of the candidate sensor-sub-circuits is evaluated with reference to the specified requirements, and each of the candidate ICs evaluated with reference to the requirements and the sensor-sub-circuits. Generally, the method further includes communicating to a user a number of candidate circuit-designs within a predetermined percentage of the one or more target values for the circuit.

15 Claims, 19 Drawing Sheets

(56) References Cited

U.S. PATENT DOCUMENTS

| | | | |
|---|---|---|---|
| 7,003,745 B2* | 2/2006 | Subasic et al. | 716/102 |
| 7,023,366 B1* | 4/2006 | Walker et al. | 341/120 |
| 7,405,586 B2* | 7/2008 | Gupta et al. | 324/762.01 |
| 7,441,219 B2* | 10/2008 | Perry et al. | 716/118 |
| 7,937,683 B1* | 5/2011 | Herbst | 716/138 |
| 7,966,588 B1* | 6/2011 | Perry et al. | 716/100 |
| 8,024,692 B2* | 9/2011 | Suaya et al. | 716/132 |
| 8,310,265 B2* | 11/2012 | Zjajo et al. | 324/762.01 |
| 2004/0014793 A1* | 1/2004 | Hoffmann et al. | 514/343 |
| 2004/0268283 A1* | 12/2004 | Perry et al. | 716/11 |
| 2005/0085973 A1 | 4/2005 | Furem et al. | |
| 2005/0174273 A1 | 8/2005 | Luo et al. | |
| 2005/0285674 A1 | 12/2005 | Laguri | |
| 2006/0218512 A1* | 9/2006 | Arslan et al. | 716/4 |
| 2007/0168172 A1 | 7/2007 | Hong et al. | |
| 2007/0261014 A1 | 11/2007 | Iotov et al. | |
| 2008/0022185 A1 | 1/2008 | Kiryu | |
| 2008/0022241 A1 | 1/2008 | Hiller | |
| 2008/0120080 A1 | 5/2008 | Nasle | |
| 2008/0221851 A1 | 9/2008 | Chen et al. | |
| 2008/0222581 A1* | 9/2008 | Banerjee et al. | 716/4 |
| 2008/0276207 A1* | 11/2008 | Suaya et al. | 716/5 |
| 2009/0228847 A1* | 9/2009 | Suaya | 716/4 |
| 2010/0127729 A1* | 5/2010 | Zjajo | 324/763 |
| 2010/0134133 A1* | 6/2010 | Pagani | 324/763 |
| 2010/0283505 A1* | 11/2010 | Koch et al. | 326/41 |
| 2010/0306722 A1* | 12/2010 | LeHoty et al. | 716/5 |
| 2010/0325599 A1* | 12/2010 | Perry et al. | 716/122 |
| 2011/0276938 A1* | 11/2011 | Perry et al. | 716/133 |

OTHER PUBLICATIONS

USPTO Final Rejection for U.S. Appl. No. 12/789,991 dated Jul. 16, 2012; 11 pages.

USPTO Non-Final Rejection for U.S. Appl. No. 12/789,991 dated Apr. 6, 2012; 10 pages.

USPTO Requirement Restriction for U.S. Appl. No. 12/789,991 dated Feb. 17, 2012; 6 pages.

International Search Report for International Application No. PCT/US2010/036780 dated Nov. 29, 2012; 6 pages.

U.S. Appl. No. 61/217,427; "System and method for implementing a circuit using a configurable analog integrated circuit," David A. LeHoty, filed May 29, 2009; 36 pages.

U.S. Appl. No. 61/275,593; "Tool and method for refining an analog circuit design," David A. LeHoty, filed Aug. 31, 2009; 45 pages.

Written Opinion or the International Searching Authority No. PCT/US2010/036780 dated Nov. 29, 2011; 6 pages.

Paul Rako, Online tools home in on analog design, EDN, Apr. 9, 2009; 5 pages.

USPTO Advisory Action for U.S. Appl. No. 12/789,991 dated Oct. 29, 2013; 3 pages.

USPTO Final Rejection for U.S. Appl. No. 12/789,991 dated Aug. 26, 2013; 11 pages.

USPTO Non Final Rejection for U.S. Appl. No. 12/789,991 dated Apr. 16, 2013; 11 pages.

USPTO Non Final Rejection for U.S. Appl. No. 12/789,991 dated Dec. 11, 2013; 13 pages.

U.S. Appl. No. 12/789,991: "Implementing a Circuit Using an Integrated Circuit Including Parametric Analog Elements" David A. LeHoty et al., filed May 28, 2010; 60 pages.

USPTO Notice of Allowance for U.S. Appl. No. 12/789,991 dated Jan. 28, 2015; 2 pages.

USPTO Notice of Allowance for U.S. Appl. No. 12/789,991 dated Sep. 18, 2014; 8 pages.

USPTO Notice of Allowance for U.S. Appl. No. 12/789,991 dated Nov. 25, 2014; 5 pages.

Gao et al., A Reconfigurable ADC Circuit with Online-Testing Capability and Enhanced Fault Tolerance, Oct. 7-9, 2009, Defect and Fault tTolerance in VLSI Systems, 2009. DFT '09. 24th IEEE International Symposium on, pp. 202-210.

USPTO Non-Final Rejection for U.S. Appl. No. 14/606,661 dated May 23, 2016; 10 pages.

USPTO Notice of Allowance for U.S. Appl. No. 14/606,661 dated Sep. 26, 2016; 10 pages.

USPTO Notice of Allowance for U.S. Appl. No. 14/606,661 dated May 31, 2017; 2 pages.

USPTO Notice of Allowance for U.S. Appl. No. 14/606,661 dated Sep. 26, 2016; 11 pages.

USPTO Requirement for Restriction/Election for U.S. Appl. No. 12/789,991 dated Feb. 17, 2012; 6 pages.

USPTO Non Final Rejection for U.S. Appl. No. 14/865,163 dated Aug. 31, 2017; 11 pages.

USPTO Non Final Rejection for U.S. Appl. No. 14/865,163 dated Nov. 3, 2017; 4 pages.

\* cited by examiner

| Single Sensor Trade-off | | 'sensor measurement name in overall circuit design' | | | |
|---|---|---|---|---|---|
| Row | Characteristic | Candidate 1 | Candidate 2 | Candidate 3 | (... more ...) |
| A | Sensor | | | | |
| B | Actuator | | | | Accuracy Goal '=== slider widget ===' |
| C | Accuracy | | | | Accuracy Goal 0.0015% of full scale |
| D | Rate | | | | Rate Goal '=== slider widget ===' |
| E | Power | | | | Rate Goal 2000 Hz. |
| F | Sense Range | | | | Temperature Goal Min -20 °C |
| G | Temperature | | | | Temperature Goal Max +80 °C |
| H | Cost | | | | |
| I | Availability | | | | |
| J | Calibrations | | | | |
| K | Digital Voltages | | | | |
| L | Analog Voltages | | | | |
| M | Manufacturers | | | | |
| N | Distributors | | | | |
| | | '=== slider widget to scroll through all Candidates ===' | | | |

FIG. 8A

| System Trade-off | | 'System design name' | | | |
|---|---|---|---|---|---|
| Row | Characteristic | Total System | Sensor ☐☐ Sub-circuit 1 | Sensor ☐☐ Sub-circuit 2 | (...more....) | (Note: sub-circuit headings also include ☐ to enable the 'Accuracy' & 'Rate' sliders) |
| A | Sensor | | | | | |
| B | Actuator | | | | | Accuracy Goal '=== slider widget ===' |
| C | Accuracy | | | | | Accuracy Goal 0.0015% of full scale |
| D | Rate | | | | | Rate Goal '=== slider widget ===' |
| E | Power | | | | | Rate Goal 2000 Hz. |
| F | Sense Range | | | | | Temperature Goal Min -20 °C |
| G | Temperature | | | | | Temperature Goal Max +80 °C |
| H | Cost | | | | | |
| I | Availability | | | | | |
| J | Calibrations | | | | | |
| K | Digital Voltages | | | | | |
| L | Analog Voltages | | | | | |
| M | Manufacturers | | | | | |
| N | Distributors | | | | | |
| | | | '=== slider widget to scroll through all Sensor Sub-circuits ===' | | | |

FIG. 8B

INTEGRATED CIRCUIT INCLUDING PARAMETRIC ANALOG ELEMENTS

CROSS-REFERENCE TO RELATED APPLICATIONS

The present application claims the benefit of priority under 35 U.S.C. 119(e) to U.S. Provisional Patent Application Ser. No. 61/275,593, entitled "Tool and Method for Refining an Analog Circuit Design," filed Aug. 31, 2009, which application is hereby incorporated by reference in its entirety.

TECHNICAL FIELD

The present disclosure relates generally to electrical circuits and more particularly to a framework or environment and methods of using the same for designing or refining and implementing a circuit including an integrated circuit including parametric analog elements.

BACKGROUND

Conventional methods of designing analog or mixed analog/digital circuits require services of one or more highly skilled analog design engineers. Typically, the design process follows a systematic approach involving a number of distinct steps. These steps include meeting with a customer; creating a preliminary schematic circuit diagram on paper; identifying components that will meet operating specifications of the circuit; simulating the circuit using mathematical or computer programs to verify the design; and building and testing a prototype of the design against the customer specification. Generally, each of the above steps must be repeated one or more times to satisfy customer requirements.

More recently, advanced computerized design tools have been introduced that allow engineers to design an analog circuit using an exemplary or model and to select and to facilitate prototyping of the circuit by interconnecting blocks of sub-circuits on a programmable integrated circuit (IC).

However what all of the existing methods and design the tools share a common deficiency in that they require a high level of expertise in analog and/or mixed signal design in order to be used proficiently.

SUMMARY

A computerized or computer-based circuit optimization or tradeoff tool and methods for using the same are provided for designing or refining and implementing a circuit including an integrated circuit including parametric analog elements.

In one embodiment, the method comprises: receiving information on a number of candidate sensor-sub-circuits and a number of candidate parameterizable-ICs, each of the candidate parameterizable-ICs including a number of parametric analog circuit elements for which operating parameters can be set, and one or more user specified requirements for the circuit including physical properties to be sensed by the circuit and target values for characteristics of the circuit; evaluating each of the candidate sensor-sub-circuits with reference to the specified requirements, and evaluating each of the candidate parameterizable-ICs with reference to the specified requirements and the candidate sensor-sub-circuits; and communicating to a user a number of candidate circuit-designs within a predetermined percentage of the one or more target values for the circuit.

In another embodiment, the Circuit Tradeoff Tool (CTT) comprises a computer-readable medium embodying a set of instructions that cause a computer to perform a process including: receiving from a Circuit Design Tool (CDT) a number of candidate-circuit designs, each comprising circuit-elements including one or more sensors, actuators, and a parameterizable integrated circuit (IC); listing a number of candidates for each of the circuit-elements; receiving from a user-interface a weighted list of target-circuit characteristics including a target value for each target-circuit-characteristic; obtaining data on each of the candidate circuit-elements related to the target-circuit-characteristics; calculating values for the target-circuit characteristics using data on the candidate circuit-elements; and comparing the calculated values to the target value and identifying from among the number of candidate-circuit designs and number of candidates for each of the circuit-elements at least one design and list of circuit elements that meets or best meets the target values for the weighted list of target-circuit-characteristics.

Other embodiments of the method and tool are also provided.

BRIEF DESCRIPTION OF THE DRAWINGS

These and various other features of a Circuit Tradeoff Tool and method for designing or refining and implementing a circuit including an integrated circuit including parametric analog elements will be apparent upon reading of the following detailed description with the accompanying drawings and the appended claims provided below, where:

FIG. 8A illustrates a user interface page for a circuit comprising a single sensor-sub-circuit refined using a CTT and method according to an embodiment of the present disclosure;

FIG. 8B illustrates a user interface page for a circuit comprising multiple sensor-sub-circuits refined using a CTT and method according to an embodiment of the present disclosure.

DETAILED DESCRIPTION

A framework or environment and method of designing or refining and implementing an analog or mixed signal circuit comprising one or more parameterizable Integrated Circuits (ICs) is provided. By parameterizable IC, it is meant an IC including configurable and fixed analog sub-circuits, components, or elements for which operating parameters can be set. By mixed signal circuit, it is meant a circuit including both analog and digital sub-circuits, components or elements.

Reference in the description to "one embodiment" or "an embodiment" means that a particular feature, structure, or characteristic described in connection with the embodiment may be included in at least one embodiment of the dual protocol input device or method. The appearances of the phrase "one embodiment" in various places in the specification do not necessarily all refer to the same embodiment. The term "to couple" as used herein may include both to directly electrically connect and to indirectly connect through one or more intervening components.

Briefly, the environment and method of the present disclosure enables a user unfamiliar with analog circuit design to design and implement an analog or mixed signal circuit comprising one or more parameterizable ICs based on user specifications of what the circuit is to do, and not what is in the circuit or on the IC. The environment and method according to various embodiments will now be described with reference to FIGS. 1 to 9.

Figure 1:
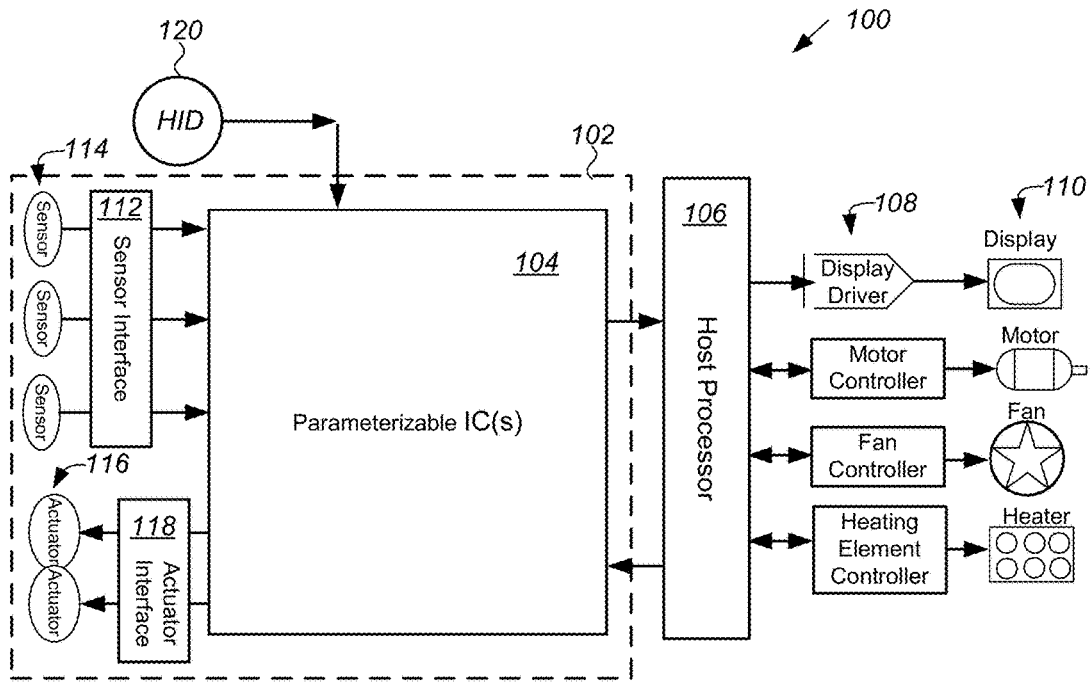
FIG. 1 is a functional block diagram of a circuit including an Integrated Circuit (IC) including parametric analog elements designed and implemented using a framework or environment and method according to an embodiment of the present disclosure.

FIG. 1 illustrates a functional block diagram of a host circuit or system 100 comprising or using a circuit 102 including a one or more parameterizable integrated circuits (ICs) 104 according to an embodiment of the present disclosure. In addition, to the circuit 102, the host system 100 can further include a host processor 106 to which a number of drivers and/or controllers 108 are coupled to control or operate any number of external systems, actuators or components 110 including, for example, displays, motors, fans, heating elements etc.

The parameterizable IC 104, described in detail herein below, can include, inter alia, multiple input/outputs (I/O) devices, such as isolation buffers or amplifiers, multiplexers (MUXs), analog-to-digital converters (ADCs) and digital-to-analog converters (DACs). In addition, the parameterizable IC 104, the circuit 102 can further include a sensor interface 112 through which a number of sensors 114 couple to I/O devices of the parameterizable IC, and a number of output devices or actuators 116 coupled to the parameterizable IC through an actuator interface 118. The sensors 114 can include discrete analog sensors adapted to sense one or more of a number of properties or states including pressure, temperature, weight, humidity, air-flow, acceleration, tilt, rotation, position, light, current, voltage, inductive, gas, liquid-level, and touch sensing, such as capacitive sensing, touch screens, touch pads and proximity sensing or any other physical or electrical quantity for which an analog sensing element exists, and for which the parameterizable IC 104 can generate a measurement report or operate an output device or actuators 116. Actuators 116 coupled to the parameterizable IC 104 can include visual or audible indicators, such as a speakers, or LEDs, and/or external systems or controllers therefore. External systems can include, for example, displays, AC motors, DC motors, fans, fuel pumps, instrument gauges, lighting/LEDS, and power control devices, such as battery chargers or power meters, heating elements etc. Additionally, the circuit 102 can further include a human interface device or HID 120 coupled to the parameterizable IC 104 through which a user can interact directly with the parameterizable IC or the host system 100.

Briefly, a parameterizable-IC according to the present disclosure includes: (i) a number of parametric sensing signal chains, each including a number of analog and digital elements and sub-circuits, for which operating parameters can be set; (ii) a number of input pins to the sensing signal chains, each of the input pins electrically coupled to one or more external sensing elements for the measurement of physical proprieties for which sensing elements exist; and (iii) a scheduler to schedule resources to the parametric sensing signal chains based on measurement priorities, measurement rates and the available parametric analog and digital circuit elements resources allocated to each measurement. A layout and interconnection of the number of analog and digital elements and sub-circuits is fixed relative to output pins of the IC, and the operating parameters of the analog and digital elements and sub-circuits are set to form or define the number of parametric sensing signal chains. The parametric signal chain resources can include a number of analog and digital circuit elements for which operating parameters can be set, such as analog multiplexers, analog gain blocks, analog common mode shifting blocks, analog and digital noise suppression blocks, analog-to-digital converters, digital averaging and filtering, digital gain adjustment, linearity adjustment, and compensation for temperature or other measured physical quantity. The scheduler operates autonomously to optimize resource allocation and measurement accuracy as per user specified targets or target values, and, optionally to implement changes over time in measurement rate or accuracy.

Figure 2:
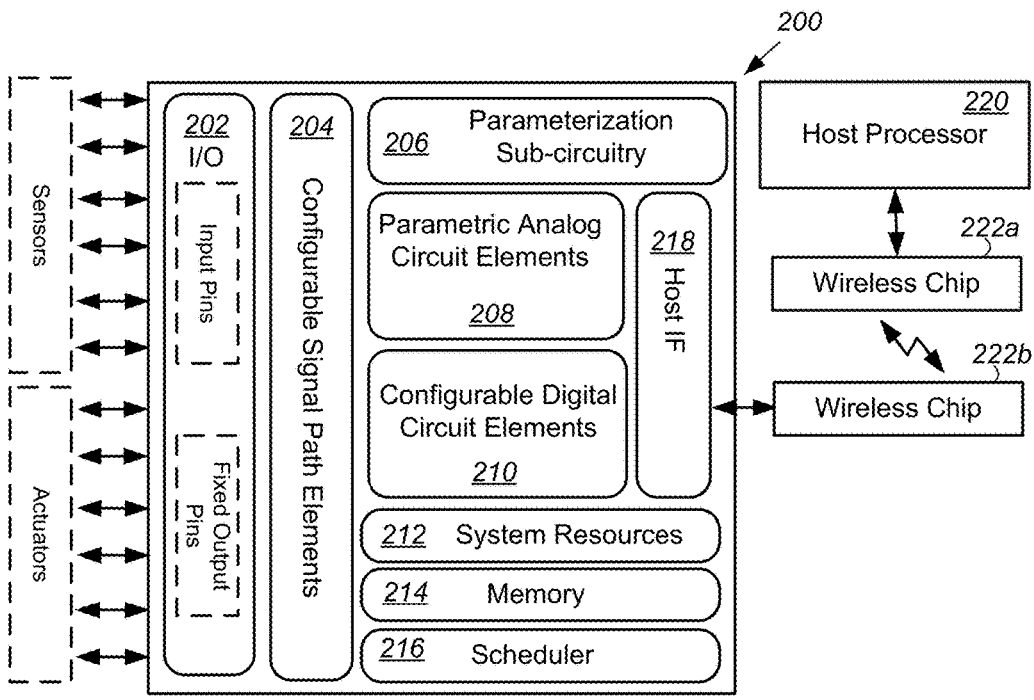
FIG. 2 is a functional block diagram of a single chip architecture of a parameterizable IC for which operating parameters of analog elements can be set according to an embodiment of the present disclosure.

FIG. 2 illustrates a functional block diagram of a parameterizable IC 200 according to an embodiment of the present disclosure. Referring to FIG. 2, the parameterizable IC 200 generally includes a number of inputs and output (I/O 202), configurable signal path elements 204, and parameterization sub-circuitry 206, fixed parametric analog circuit elements 208. The I/Os 202 can include a number of devices, such as isolation buffers or interfaces coupled to input output pins of the IC 200, including a number of fixed output pins. By fixed output pins, it is meant output pins electrically coupled either directly to the fixed parametric analog circuit elements 208 or through a signal path that is not configurable or cannot be re-configured after parameterization of the IC. The configurable signal path elements 204 can include multiplexers (MUXs), amplifiers, analog to digital converters (ADCs), and digital to analog converters (DACs). The fixed parametric analog circuit elements 206 generally includes analog blocks, sub-circuits and components such as Analog Comparators, Operational Amplifiers, Programmable Gain Amplifiers, Analog Voltage References, Analog Current References, Voltage Diagnostics, Current Diagnostics, Multiplexers, Analog Switches, Voltage Monitors, Current Drivers, Temperature Sensor, Programmable I/Os, Oscillators, Charge Pump, Voltage Regulators. The parameterization sub-circuitry 206 can include a number of switching elements, fusible links and signal path, through which parameters can be set for the parametric analog circuit elements 206.

In one embodiment, such as that shown in FIG. 2, the parameterizable IC 200 can further include configurable digital circuit elements 210, system resources 212, memory 214, a scheduler 216 to schedule resources of the IC, including sampling of the ADCs, according to measurement priorities, measurement rates and the available parametric analog and digital circuit elements resources allocated to each measurement, and a specialized or dedicated interface, such as a host IF 218, through which the IC is coupled to a host system or processor 220. In certain embodiments, the parameterizable IC 200 is remotely located from the host processor 220 and is coupled thereto through a wired current loop or optical fiber. In other embodiments, such as that shown, the parameterizable IC 200 is wirelessly to coupled the host processor 220 through a pair of and/or or digital transceiver chips 222a and 222b utilizing, for example, one or more of a number of standard wireless communication protocols, including wireless USB communication protocol, I$^2$C protocol, or a Serial Peripheral Interface (SPI) protocol.

The configurable digital circuit elements 210, can include first-, second-, or any higher order gain and offset compensation for temperature, and non-linearity compensation; digital signal de-bouncing; filtering options such as the coefficients and lengths of filters; FIFO buffer length; Interrupts and flagged events such as FIFO is full or sampled level is above a warning level; Communication protocol, i.e. which protocol is the downstream processor expecting that is selected from a short list with the default protocol being, for example, I2C protocol. System resources 212 can include clocks, counters, etc.

Memory 214 can include any number of suitable volatile and/or non-volatile semiconductor memory devices, such as registers, used to temporarily or permanently store data or instructions for setting parameters, configuring, controlling, and accessing the parametric analog circuit elements 208 or digital circuit elements 210.

In one embodiment, the memory 214 includes multiple registers to hold alternate parameterization or configuration settings to support switching between different power consumption or operating modes. The parameterizable IC 200 can switch between these alternate configuration settings based on a timer, a sensed condition, and/or a mode change command received from the host system. The alternate parameterization or configuration settings are calculated during circuit design by a circuit design tool (CDT), or by a circuit trade-off tool (CTT). Generally, initial parameterization or configuration settings are calculated during circuit design or optimization. However, optionally the parameterization settings can be calculated or updated in real-time, for example, through a host system.

An embodiment of a framework or environment 300 for designing and implementing a circuit including a parameterizable IC using a circuit design tool (CDT) and a circuit trade-off tool (CTT) will now be described with reference to FIGS. 3 and 4.

Figure 3:
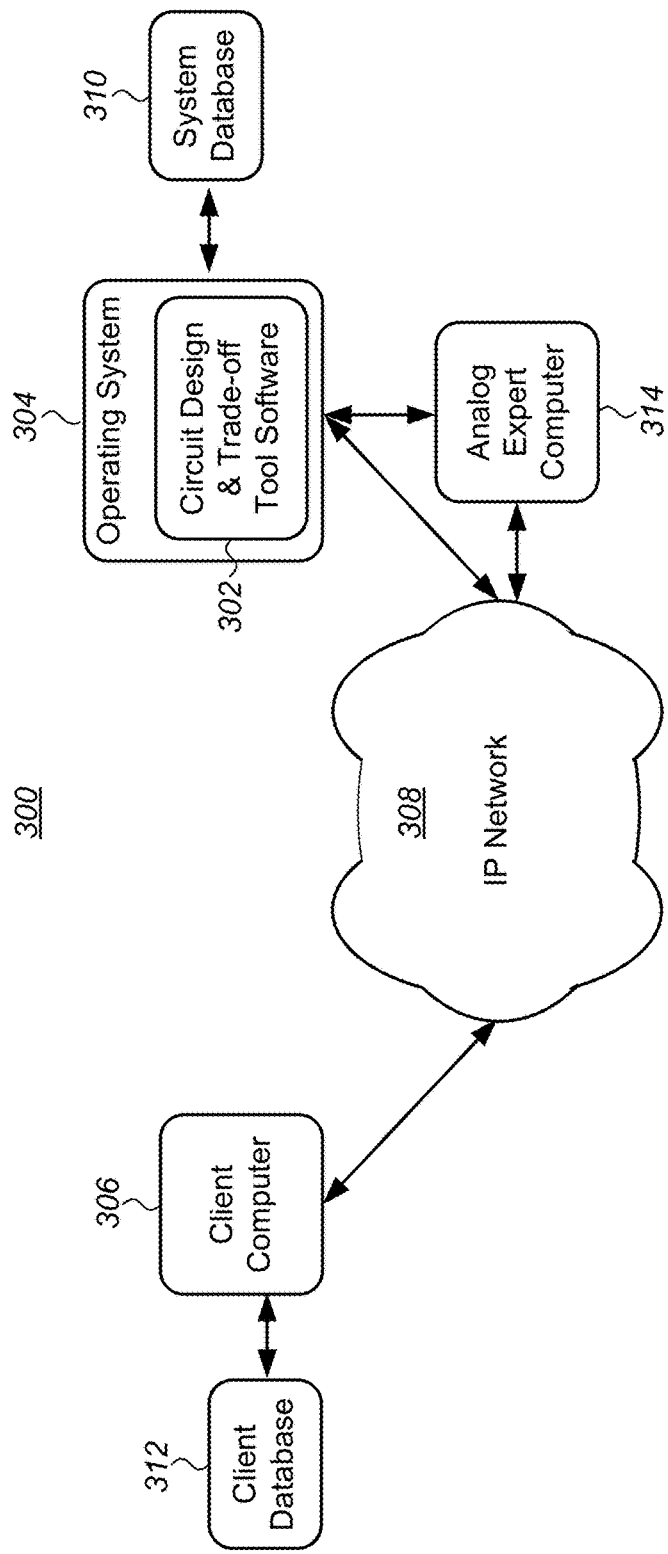
FIG. 3 block diagram of an embodiment according to the present disclosure of a framework or environment for designing and implementing a circuit including a parameterizable IC, the framework including a server and coupled to a client computer through an Internet Protocol (IP) network.

Referring to FIG. 3, the environment 300 generally comprises computer executable code or instructions (CDT and CTT software 302) embodied in a computer readable medium and running in an operating system on a server computer 304. A client computer 306 is coupled to the server computer 304 through an Internet Protocol (IP) network 308, such as wide area network, or the Internet or World Wide Web. The environment 300 further comprises a system database 310 coupled to the server computer 304, and storing data on available sensors, actuators, and parameterizable ICs. Data stored can include information on accuracy, range, cost, availability, power requirements, physical size, heat dissipation required, part-count, number of unique parts and/or manufacturability. By manufacturability, it is meant the ease with which a circuit including the sensor or actuator can be designed, built or assembled and/or calibrated. The system database 310 can be directly coupled to the server computer 304, as shown, or can be remotely located from the server computer and coupled thereto through the IP network 308. In the latter embodiment, the system database 310 can be a distributed or virtual database, including, for example, information on sensor on accuracy, range, and cost made available and kept up to date by the sensor manufacturer over the Internet.

Additionally, as in the embodiment shown, the environment 300 can further include a client database 312 coupled to the client computer 306, for storing locally a subset of the data stored in the system database 310, completed analog circuit solutions, and/or work-in-progress. For example, the client database 312 can store configuration data on a completed analog circuit solution to enable a user to quickly configure and calibrate additional implementations of the completed analog circuit substantially without repeating all of the design, simulation, and testing steps of the original analog circuit solution, and without reconnecting or re-synchronizing with the system database.

In another aspect of the invention, the software 302 further comprises instructions that enable the user to interact live, with an analog engineer or expert about a circuit design or solution that may be starting, in progress, or substantially complete. By analog expert, it is meant one who is knowledgeable in one or more of analog circuit specification, design, simulations, calibrations, prototypes, implementations, and layouts. Preferably, the software 302 further comprises instructions that enable the user to interact with the analog engineer verbally or through text messages, including email and instant messaging, via the internet or other IP network 308 or verbally over a telephone network. More preferably, the analog engineer has access to and the ability to override specified requirements, including measurement requirements, output requirements, and overall circuit requirements, and to override automatically calculated solutions of the original analog circuit solution via the IP network 308. The analog engineer can access the environment through a separate computer 314 directly coupled to the IP network 308, as shown, or can access the IP network through the server computer 304.

Figure 4:
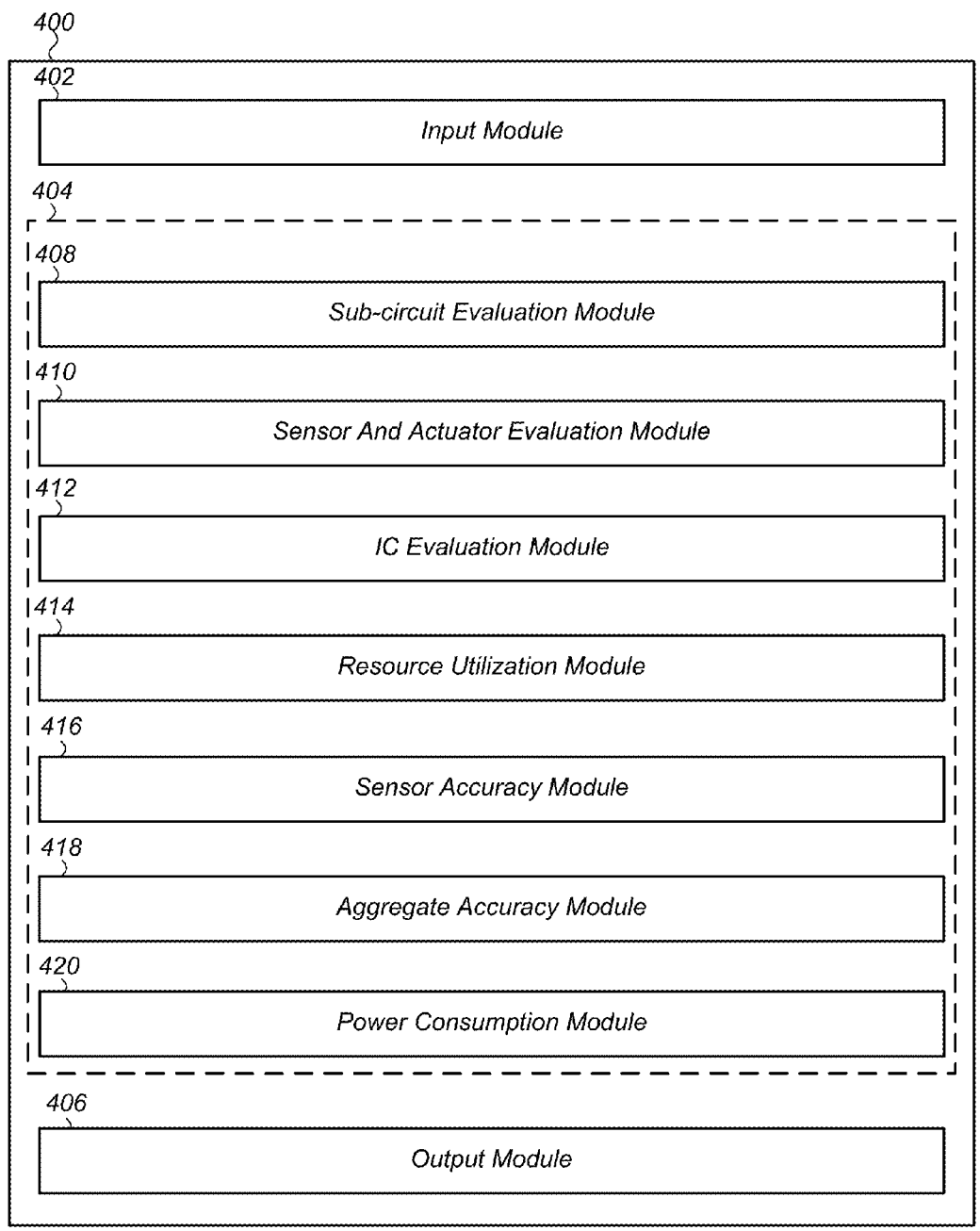
FIG. 4 is a block diagram illustrating functional modules of a computer design and tradeoff tool according to an embodiment of the present disclosure.

A block diagram illustrating functional modules of CDT and CTT software 400 according to an embodiment of the present disclosure is shown in FIG. 4. Briefly, the software 400 includes: a input module 402 for reading or receiving default settings and user specified requirements including measurement requirements, output requirements, overall circuit requirements, and, optionally, overrides of the default settings; a design module 404 to: (i) design based on the specified requirements a circuit comprising an integrated circuit (IC) including a number of parametric analog circuit elements for which operating parameters can be set and a number of sub-circuits electrically coupled thereto; and (ii) verify the circuit design satisfies a number of the specified requirements; and an output module 406 to: (i) set parameters of at least one of the parametric analog circuit elements of the IC based on the circuit design; and (ii) communicate to the user instructions for electrically coupling the number of sub-circuits to the parameterizable IC to implement the circuit.

The design module 404 includes a sub-circuit evaluation module 408 for reading or receiving manufacturer-specified characteristics of the sub-circuit components and evaluating a candidate sub-circuit; a sensor and actuator evaluation module 410 for reading or receiving manufacturer-specified characteristics of candidate sensors and/or actuators of the sub-circuit including cost, power consumption, and/or availability etcetera and evaluating a candidate sensor; an IC evaluation module 412 for evaluating a candidate parameterizable IC; a resource utilization module 414 for calculating the usage by the sensor of parametric analog and digital circuit elements, such as an ADC, in the sub-circuit and/or the complete circuit, both internal and external to the candidate parameterizable IC; a sensor accuracy module 416 for calculating the effective sensor reading accuracy without the contribution from the ADC; an aggregate accuracy module 418 for calculating the aggregate accuracy of the sensor with multiple readings to the ADC per report period; and a power consumption module 420 for calculating power consumption of a sub-circuit and/or the complete circuit. By effective, it is meant the accuracy of the measurement of the sensed physical property, taking into account both accuracy of the sensor and of other elements of the sensing sub-circuits, both internal and external, to the parameterizable-IC.

Note, the circuit or sub-circuit alternatives, e.g. circuits or sub-circuits using alternative sensors or other components or other sub-circuit configurations, can be generated by a separate design tool CDT or circuit tradeoff tool CTT. When the initial alternative circuits are generated by the CDT, these alternatives are inputs to the CTT. When the alternative circuits are generated or expanded by the CTT, the CTT uses a primary example circuit or sub-circuit and a set of rules for identifying candidate alternative components or sub-circuit configurations. An example of an alternative sub-circuit configuration follows rules to take a sensor that is connected to the IC using differential inputs and modify the connection to use a single-ended input with some additional biasing. In this example, the single-ended connected sensor has less accuracy than the same sensor connected differential. However, the single-ended connection uses one less IC pin and may have enough accuracy to meet the user specifications and because one less pin is used, can enable use of a less expensive IC for the complete circuit.

The functions performed by each of the above modules, as well as sub-modules not shown in this figure, will be described in greater detail below with reference to methods of designing and refining performance of a circuit including a parameterizable IC according to embodiments of the present disclosure.

Embodiments of methods of designing, simulating, implementing, and testing a mixed signal circuit comprising a parameterizable IC will now be described with reference to the flowchart of FIGS. 5A and 5B, and exemplary user interface pages of FIGS. 6A-6G.

Figure 5A:
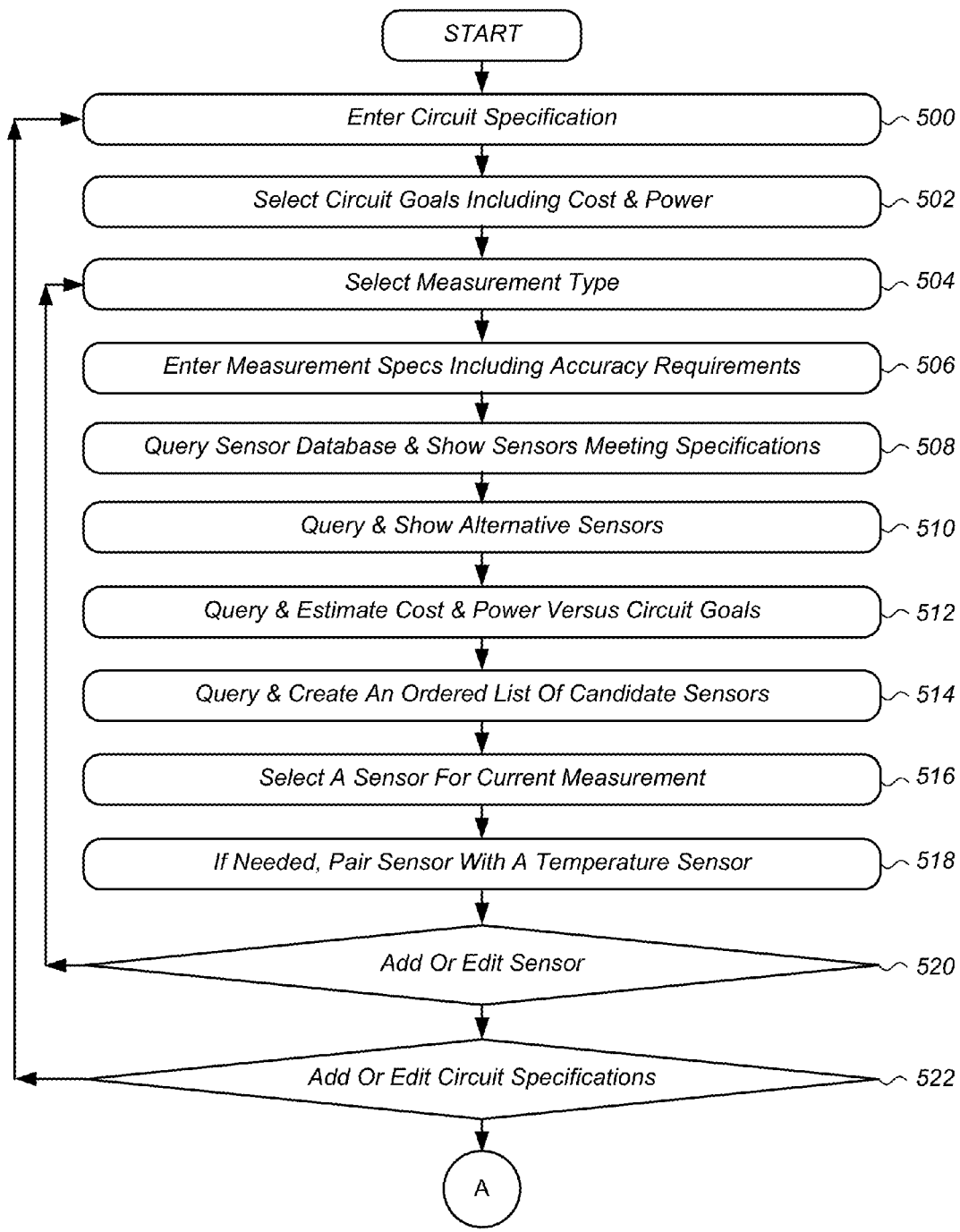
FIGS. 5A and 5B are a top-level flow diagram illustrating a method of designing and implementing a circuit including a parameterizable IC using a framework or environment according to an embodiment of the present disclosure.
Figure 6A:
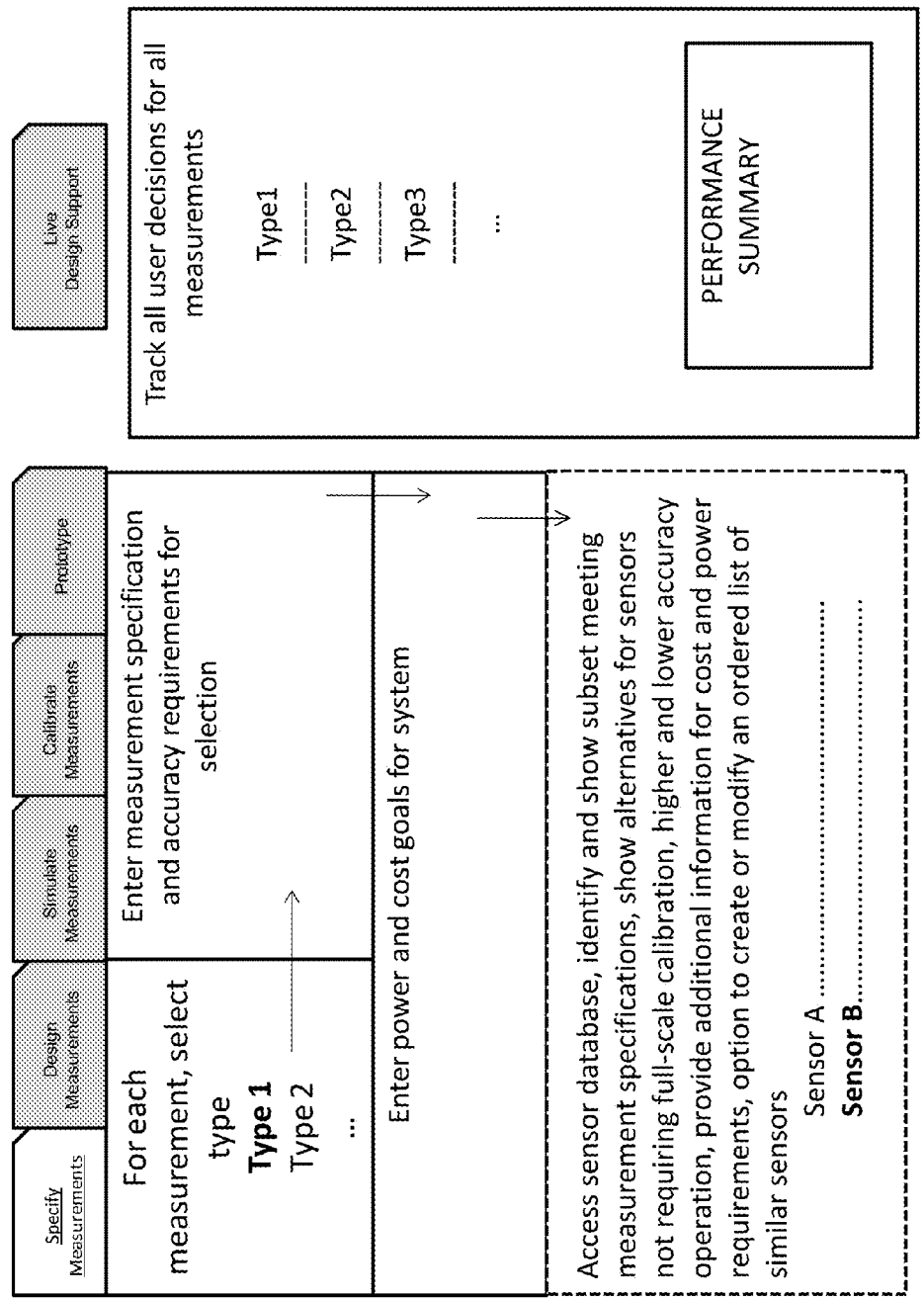
FIGS. 6A-6G illustrates a series of user interface pages for designing a circuit using a parameterizable integrated circuit (IC) according to an embodiment of the present disclosure.

Referring to FIG. 5A and FIG. 6A, in a first block or step, the user begins by specifying the requirements of the circuit. Generally, the specifying step can include specifying parameters such as temperature, flow, level, pressure, shock, tilt etc., to be monitored or measured, as well as an expected range and desired accuracy for each. Optionally, the step may further include querying and allowing the user to specify additional system level requirements including power, diagnostics, alerts, and cost goals or limitations, and/or a vendor or manufacturer for sensors to be used with the circuit. In certain embodiments, the system can prompt the user to choose or specify sensors and or actuators to simplify the finished circuit or circuit calibration. For example, in one embodiment the system can query the user to select sensors or actuators utilizing common or shared power and/or reference voltages or currents. In another embodiment, the system can query the user to select one or more sensors with reduced calibration requirements that substantially eliminate the need for zero or off-set calibration.

In other embodiments, the system will automatically provide default values for requirements not specified by the user. For example, where the user has not specified a range or accuracy for a temperature to be measured, the system can automatically provide a default range of 0 to 100° C. and an accuracy of ±2.5%. Alternatively, the user may specify a bias or general preference in default values, for example, by selecting between 'more accurate' or 'higher performance' and 'lower cost'.

Sub-steps of an exemplary specifying step are described below with reference to the flow chart of FIG. 5A. Once the basic system level and measurement specifications are input, some of the following steps are optional since some of the additional information is optional and default values can be automatically provided. Referring to FIG. 5, the specifying step begins with the user entering a circuit specification (step 500). Circuit specifications can include, for example, sharing power voltage levels at known voltages and limited variations. Next, the user selects circuit goals including cost and power (step 502), and selects a measurement type (step 504). As noted above, measurement types can include temperature, flow, level, pressure, shock, tilt, or vibration or any other physical quantity for which an analog sensing element exists. The user then enters measurement specifications including accuracy requirements (step 506). The system automatically queries the sensor database and shows sensors meeting specifications (step 508). Optionally, the sensors shown for selection can include one or more sensors with reduced calibration requirements that substantially eliminate the need for full-scale calibration. If the user does not select one of the sensors meeting specifications, or requests alternatives, the system again queries the sensor database and shows alternative sensors (step 510). The user then queries the system to estimate cost and power versus circuit goals (step 512). The user then queries the system to create an ordered list of candidate sensors (step 514). The user then selects a sensor for current measurement (step 516). If needed, the system or user pairs the sensor with a temperature sensor (step 518). The system then prompts the user to add or edit sensor (step 520). If a sensor is to be added or edited, the system returns to step 504 and prompts the user to selects a measurement type. If no sensor is to be added or edited, the system then prompts the user to add or edit circuit specifications (step 522). If a circuit specification is to be added or edited, the system returns to step 500 and prompts the user to enter a circuit specification. If no circuit specification is to be added or edited, the specifying step is complete.

As part of the specification step, the system accesses a sensor database and identifies a subset of suitable sensors for the parameters to be measured, which may then be displayed for the user in a 'performance summary' identifying available sensors along with predetermined pertinent information about each, such as cost, accuracy, range and/or availability. It will be understood that this enables the user to select or specify a particular model of sensor from the list of suitable sensor. If the user fails to specify a sensor, the system can automatically choose one satisfying the default range or accuracy using predetermined criteria base on factors such as cost, rating, or reliability.

Figure 5B:
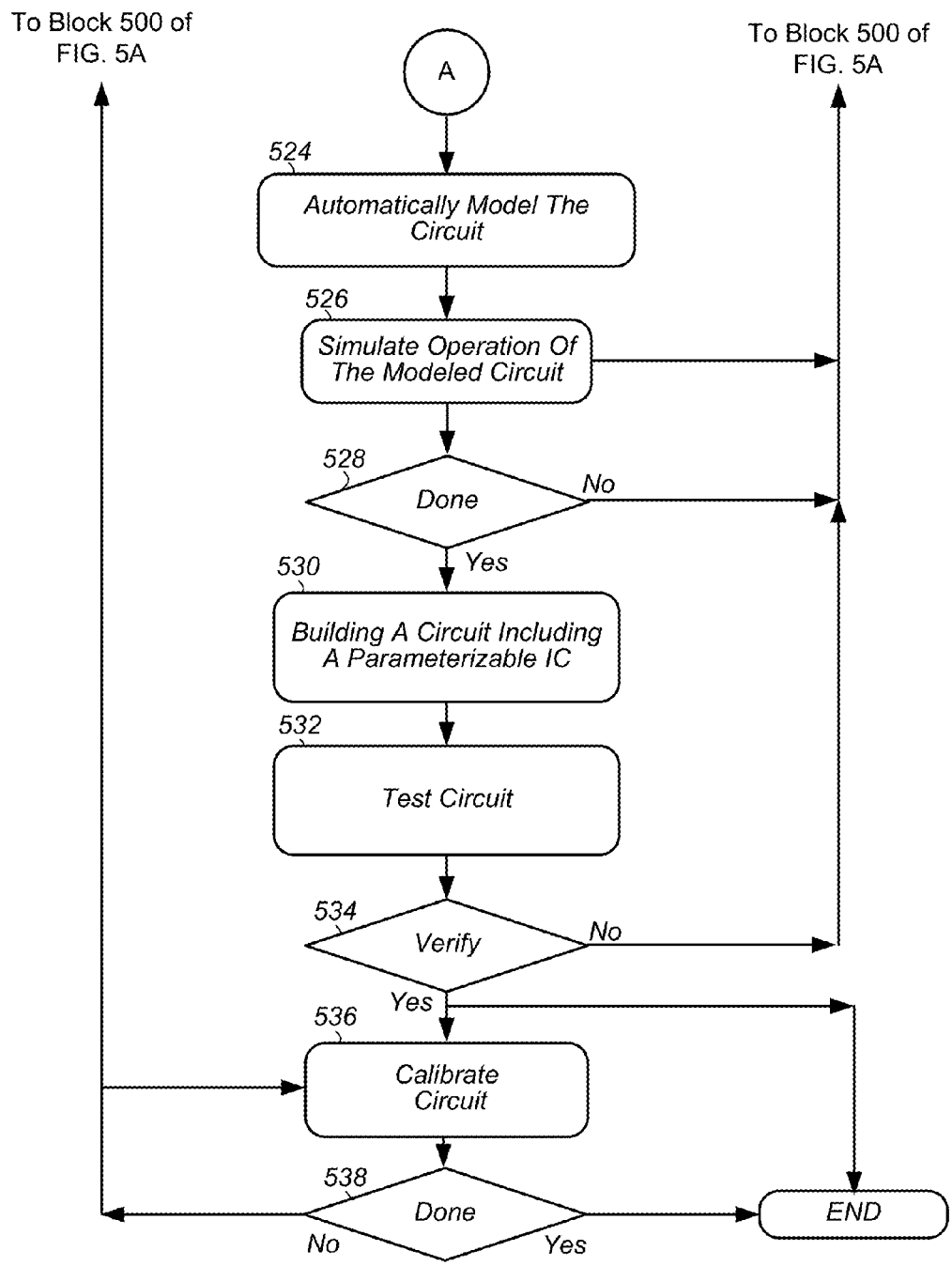
Figure 6B:
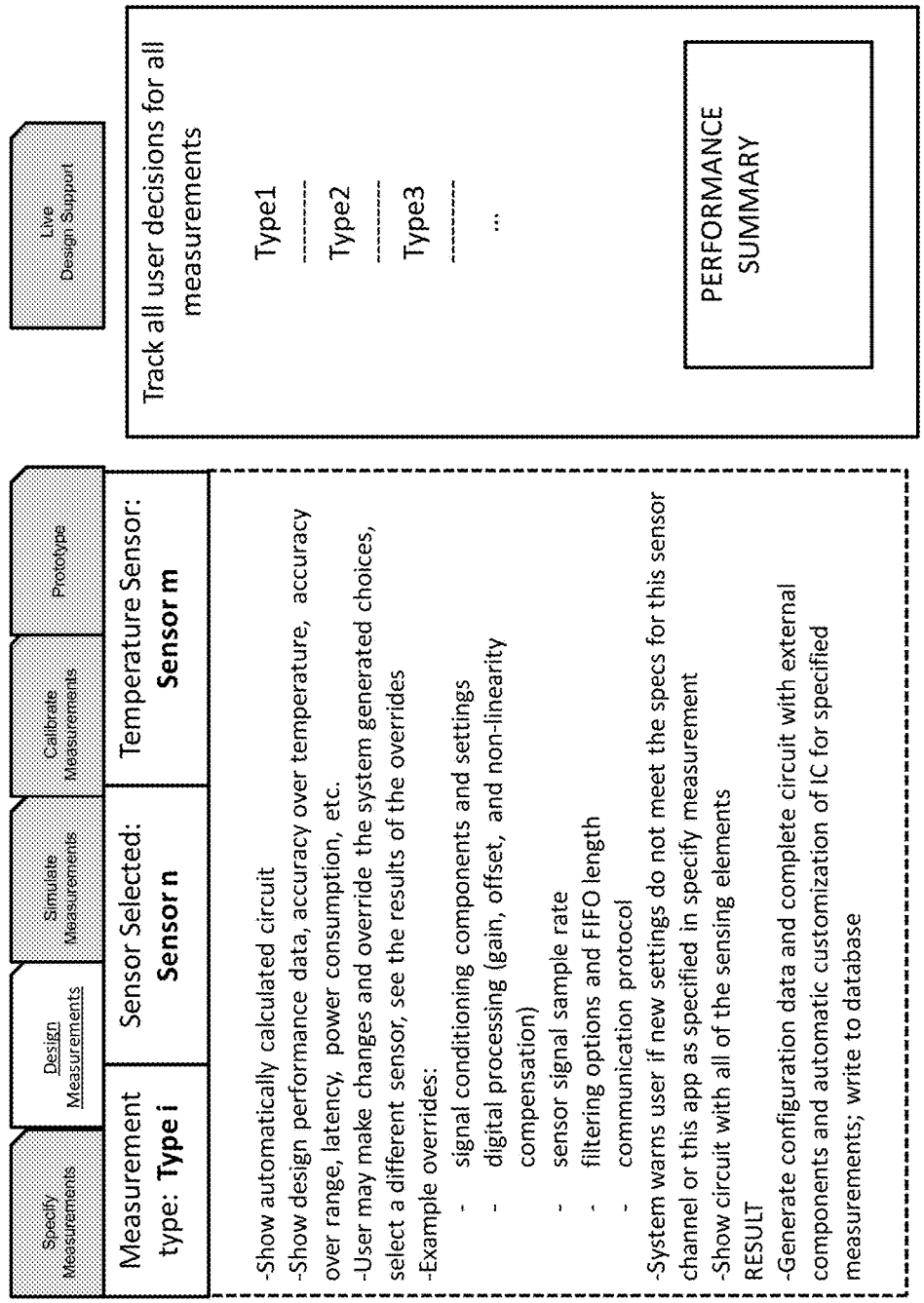

Referring to FIG. 5B and to FIG. 6B, the system automatically calculates or models the circuit using a parameterizable IC and the sensors selected in the proceeding step, and prepares to simulate operation of the modeled circuit (step 524). As part of this step, the system displays design performance data, such as accuracy over temperature, accuracy over range, and/or power consumption. The system also displays a complete parts list of circuit components, including external sensing components. Optionally, the system prepares and displays to the user a simplified schematic, block diagram or wiring diagram of the complete circuit. Now, the user may accept or reject the modeled circuit, for example by returning to the specifying step and further specifying circuit requirements. Alternatively, the system may allow the user to override system generated choices, for example, selecting a different sensor or by overriding any of the choices listed in FIG. 6B. As shown, in some embodiments the system warns the user if any overrides or changes do not meet the requirements specified in step.

Figure 6C:
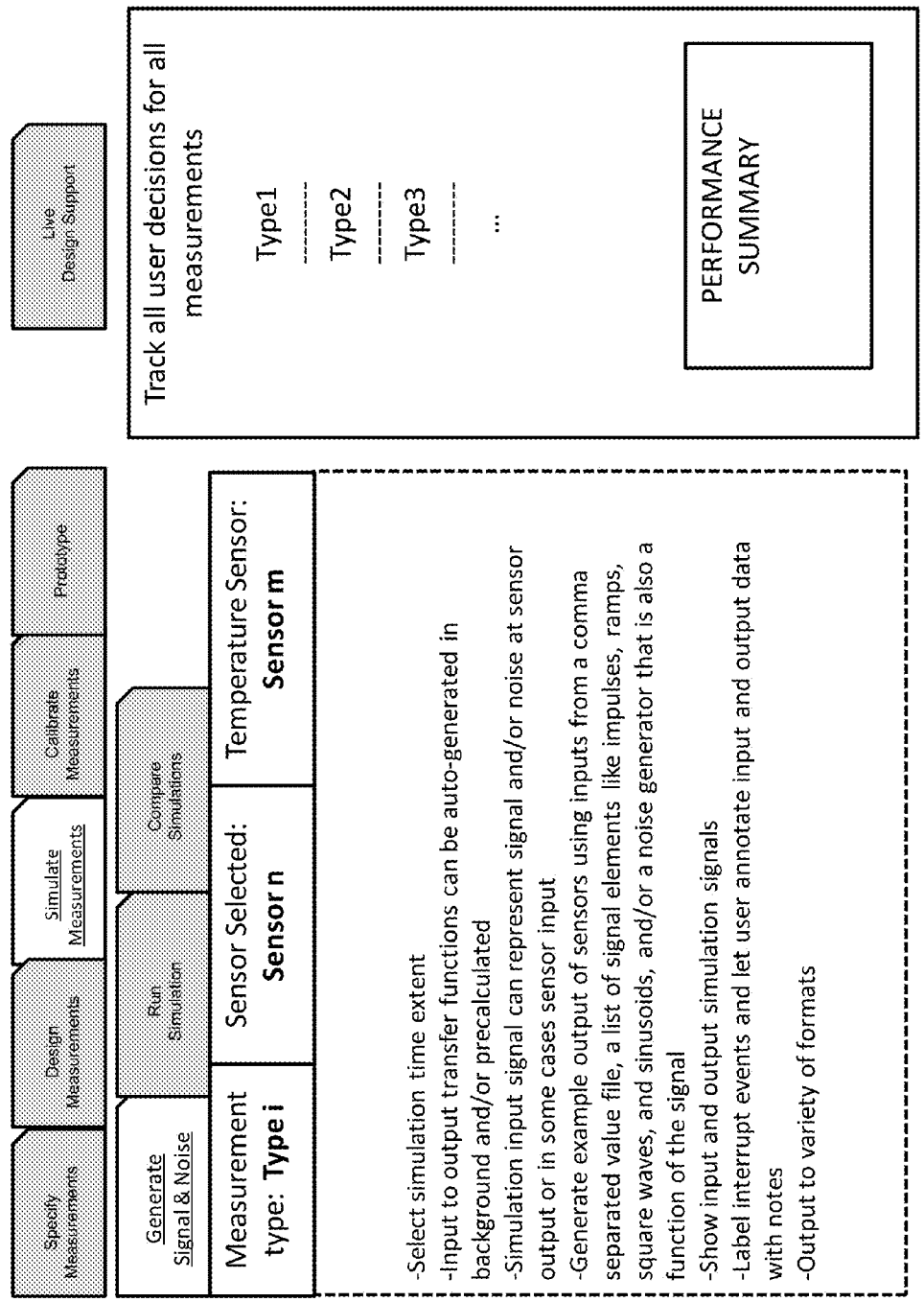
Figure 6D:
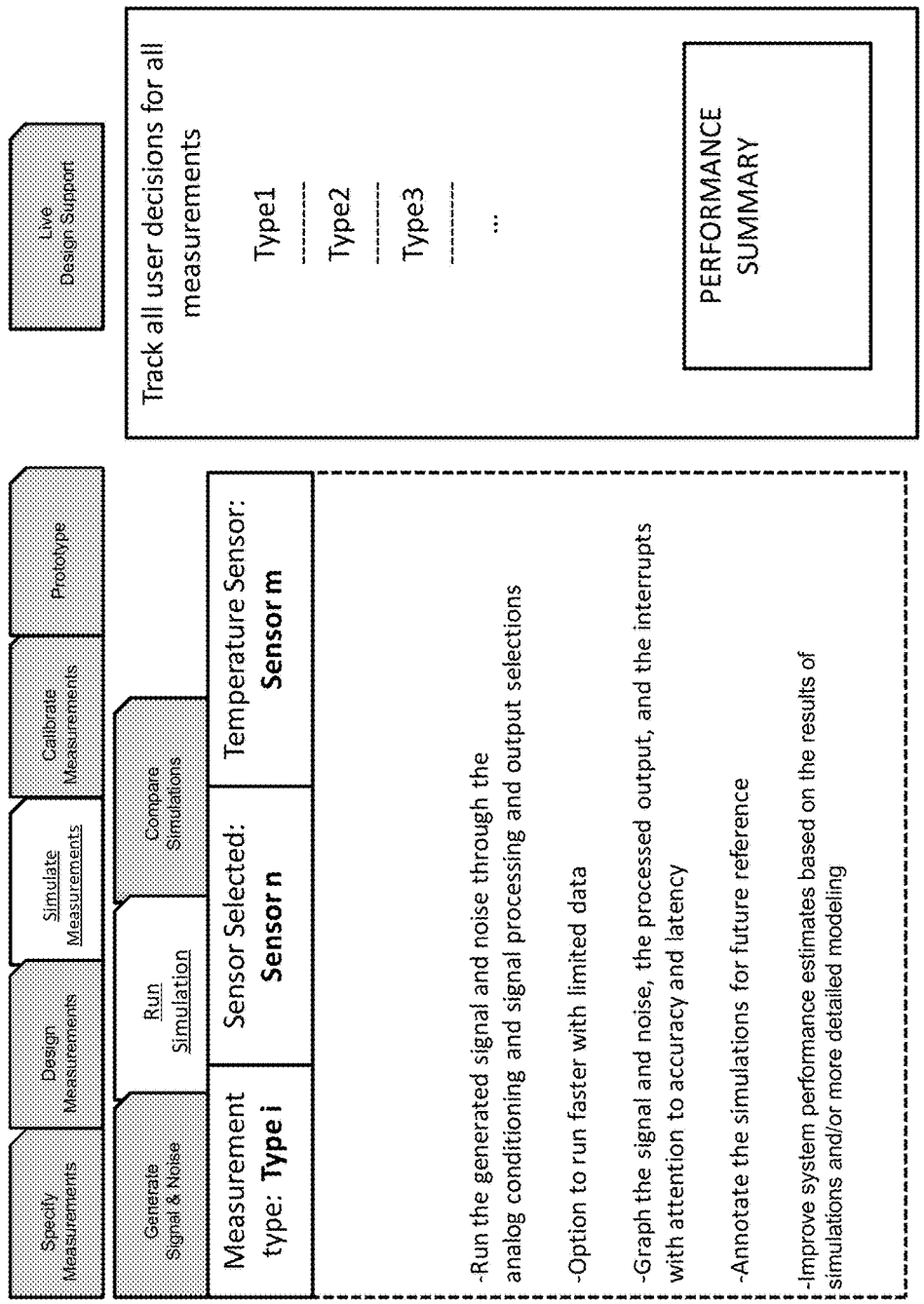

Next, the system simulates operation of the approved or accepted modeled circuit (step 526). Referring to FIG. 6C, the user can select a measurement type, a sensor or sensors for the simulation and a simulation time extent. The system then generates signals and/or noise for the selected sensors. The simulated input signals can be auto-generated in background or be pre-calculated prior to beginning the simulation. Referring to FIG. 6D, the system run the generated signal and noise through the analog conditioning and signal processing and output selections. The system then generate a simulated output (including intermediate outputs and feedback signals if any) and shows both input and output simulation signals in a variety of formats including graphically over time, and available in comma separated value file format. Preferably, the user interface page enables the user to annotate input and output data with notes, label interrupt events and output or export the simulation results as a saved or printed document or data file. Optionally, the system provides the user with the choice of running the simulation faster with limited data, or more robust, slower simulation.

Figure 6E:
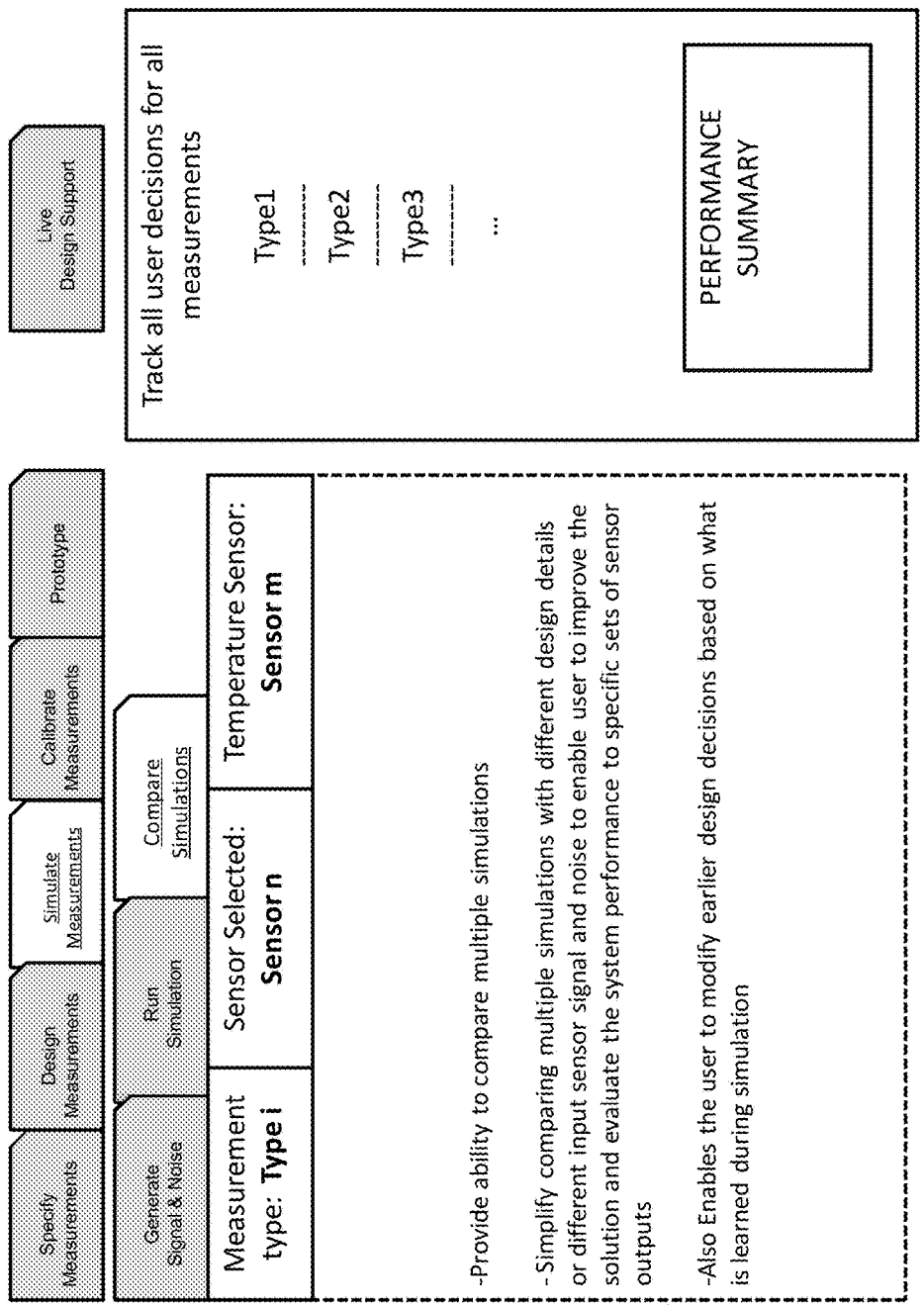

Referring to FIG. 6E, the system provides the user with the ability to compare results of multiple simulations. In certain embodiments, the system simplifies the comparing of multiple simulations with different design details or different input sensor signal and noise to enable the user to evaluate the circuit performance for specific sets of sensor outputs. The system can also enable the user to modify earlier design decisions based on what is learned during simulation. Specifically, the system can then determine whether the results of the simulation are satisfactory and the modeled circuit meets the specified requirements (step 528). If not, the user may repeat the simulation with different selections or return to the specifying step and further specify or edit circuit requirements.

If the results of the simulation of the modeled circuit are satisfactory, a circuit is built using a parameterizable IC (step 530). Generally, this is accomplished by the user placing the parameterizable IC in an evaluation board or test fixture, coupling the board or fixture to the client computer, for example through a USB connection, and downloading parameterization data to the IC. The system then tests the circuit (parameterized IC) using simulated sensor signals and noise (step 532). The system verifies whether the results of the test are satisfactory and the circuit meets the specified requirements (step 534). If not, the user may return to the specifying step and further specify or edit circuit requirements. If the results of tests of the modeled circuit are satisfactory, the user completes construction of the circuit by coupling the parameterizable IC to the selected sensors, inputs, outputs and the host system through the evaluation board. The system can also suggest board layout service companies and/or calibration service companies and/or preferred components and/or preferred distributors and/or alternate suppliers, and/or worst-case component lead-time. The user can alternatively use the evaluation board to send simulation outputs to the host processor for testing of the host processor hardware (interface) and/or software.

At this juncture, the design, simulation and testing of the mixed signal circuit is complete and the user may choose to end the process. In certain embodiments, the sensors can include one or more sensors with reduced calibration requirements that substantially eliminates the need for full-scale calibration.

Figure 6F:
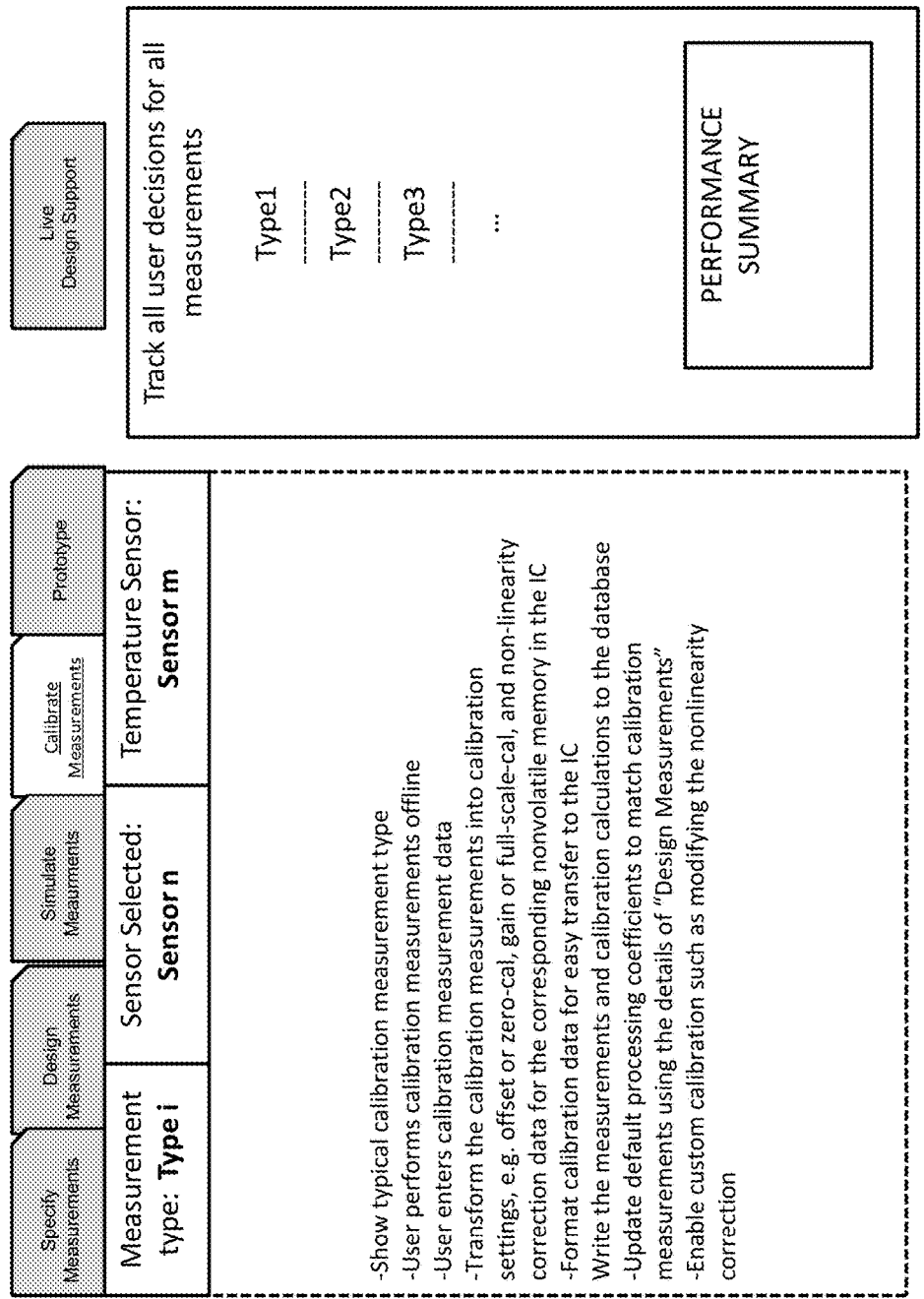

Alternatively, the user may elect to calibrate the completed and tested circuit in an optional calibration step (step 536). Referring to FIG. 6F, the user performs calibration measurements offline, and then enters calibration measurement data to the system through the client computer. The system then transforms the calibration measurements into calibration settings, e.g. offset, gain, and non-linearity correction data for the corresponding nonvolatile memory in the parameterized IC. The system also checks that the calibration settings are within allowable ranges for components of the parameterized IC and that calibrated, parameterized IC meets all specified requirements of the circuit (step 538). If the calibration check is satisfactory, the calibration data is formatted for easy transfer to the IC through a USB connection and the evaluation board, and the process is ended. If not, the use may choose to repeat the calibration process (step 536) or to return to the specifying step and further specify or edit circuit requirements.

Figure 6G:
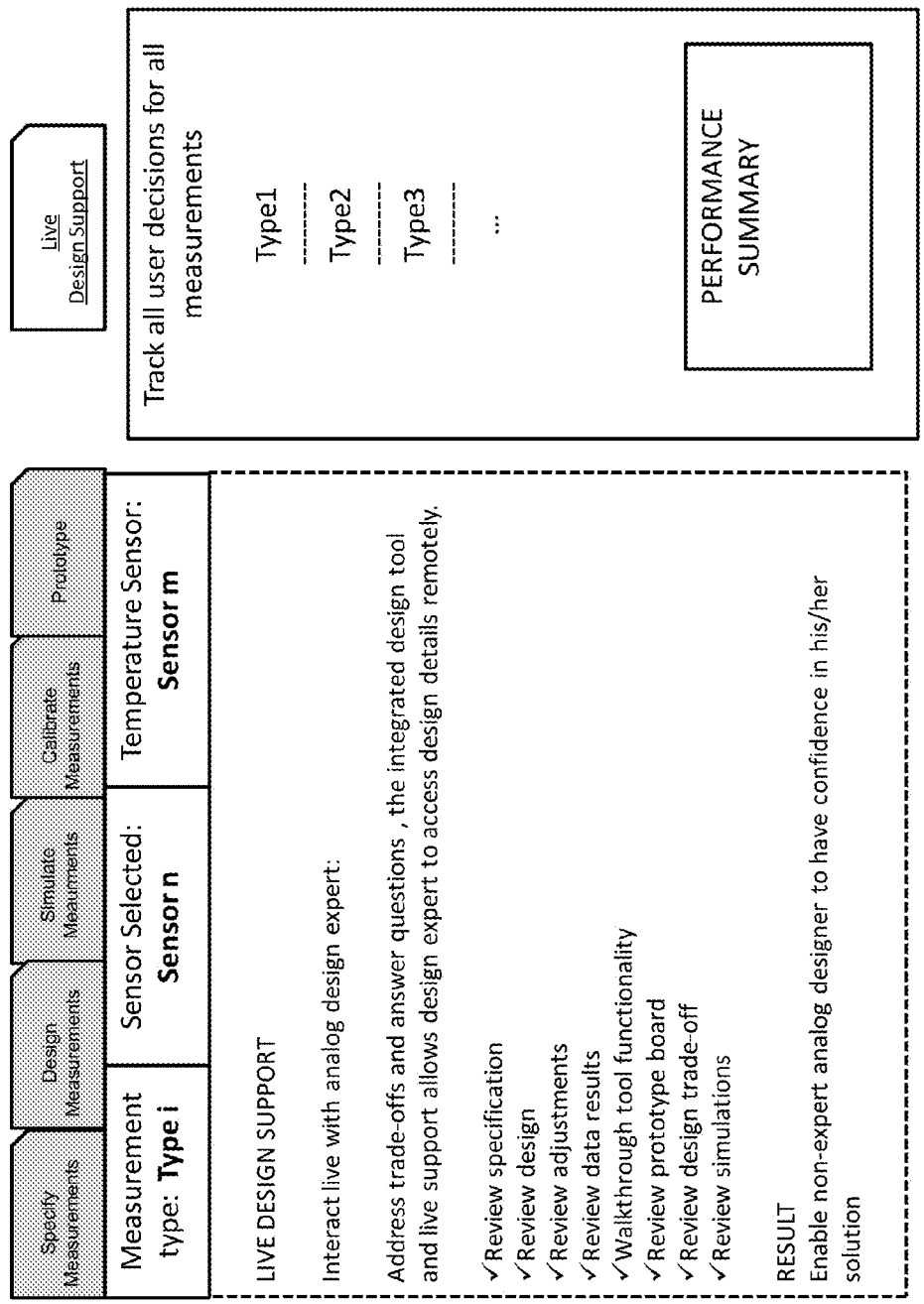

Referring to FIG. 6G, in another aspect of the invention the user may optionally at any point in the process select or click on a live design support tab in the user interface window to interact with an analog design engineer verbally or through text messages via the world wide web or other Internet Protocol network. In addition to be able to answer questions, the integrated design tool and live support allows the design engineer to access details of the users design remotely, and thereby review and if necessary correct the specification, design, simulation, prototype, testing and calibration of the circuit. As a result, an inexperienced user can have confidence in his or her circuit design and implementation.

Prior to describing a method of refining performance of a circuit using the CDT and CTT software it is instructive to provide general outlines of an approach to aggregating a set of accuracies, of an approach to estimating the number of consecutive raw samples to compensate for the loss of inaccuracy at the ADC, and of an approach to determining ADC utilization.

Aggregating a Set of Accuracies

Aggregating a set of accuracies enables a set of accuracy values to be combined into a single 'aggregated' accuracy value. The following description develops a general approach to aggregating a set of accuracies, e.g. $\{a_i\}$, is shown in Equation 1. This general form of the aggregate sum is equivalent to a simple sum when m is equal to one. This aggregate sum is equivalent to the Root-Sum-Squared (RSS) when m is equal to two.

$$\text{Aggregate\_Sum}(\{a_1\}, m) = \left(\sum_i (a_i)^m\right)^{\left(\frac{1}{m}\right)} \quad (1)$$

where m≥1 and usually m=1 or m=2. Equation 1 can also be used to combine two or more aggregate sums. When aggregate sums are combined, it is not necessary for the m values to be the same. For example, an aggregate sum can be calculated with an m value of say two. In addition, a second disjoint aggregate sum can be calculated with an m value of say 1.8, and, these two aggregate sums can be combined using Equation 1 with say an m value of one.

The calculation of the aggregate accuracy for an ideal ADC is shown in Equation 2.

$$\text{Aggregate\_Accuracy (Ideal\_ADC)} = \text{Agregated\_Sum}(\{a_i\},m) \quad (2)$$

where ADC_Accuracy$\notin \{a_i\}$. This is simply the aggregated accuracy without any contribution from the analog-to-digital conversion.

Estimating a Number of Raw Sensor Readings

The estimate of the number of consecutive raw sensor readings N combined with a box-car-like filter that effectively averages the readings and decreases the effective noise at the ADC by the square root of the number of readings is shown in Equation 3.

$$N = \left(\left\lceil \frac{(\text{ADC\_Accuracy})^2}{(\text{Report\_Accuracy})^2 - (\text{Aggregate\_Accuracy(Ideal\_ADC)})^2} \right\rceil\right)^p \quad (3)$$

where usually p=1. N is the estimate of the number of consecutive raw samples to filter together to compensate for the loss of inaccuracy at the ADC.

In addition, p is usually one or greater than one and very near to one. Another alternative to estimating N is to use a power other than two in Equation 3.

A different but related calculation of the number of samples taken between measurement reports to the host follows from the optional specification of the minimum sample rate (Nu) is shown in Equation 4. The user can specify the minimum sample rate to bound a latency of the sensor measurement alarm to the host. An example of a sensor measurement alarm is a measurement value that is greater than an alarm threshold. The sensor measurements checked for a potential alarm can be one raw measurement, several raw measurements, or several raw measurements combined using a filter.

$$N_u = \left\lceil \frac{\text{Minimum\_Sample\_Rate}}{\text{Report\_Rate}} \right\rceil \quad (4)$$

ADC Utilization

To enable the separation of a circuit with multiple sensors into independent sensor-sub-circuits, it is helpful if maximum power consumption and/or maximum ADC utilization percentage is specified or assumed for each sensor-sub-circuit. These specs are optional.

An alternative is to account for the other sensors and calculate the resulting sums for power consumption and ADC utilization percentage. These totals are then compared to specified or assumed limits. A total power consumption limit is optional. Of course, the total of the ADC utilization percentages cannot be greater than 100% since the ADC cannot be used more than 100% of the time. In addition, there may be an optional system requirement for remaining spare capacity of the ADC. For example, if there was such a requirement and its value was say 20%, then the total of the ADC utilization percentages cannot be greater than 80%.

Figure 7A:
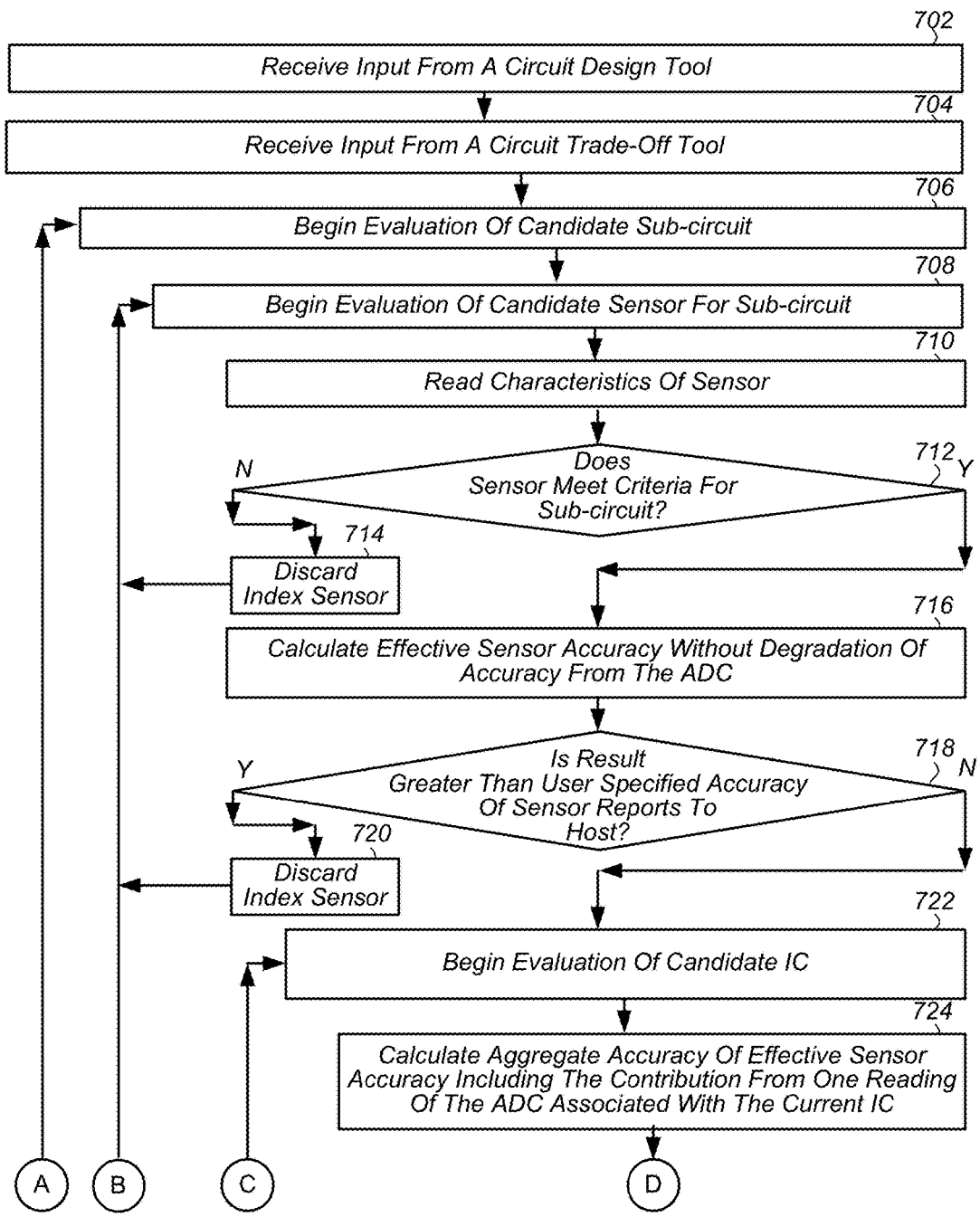
FIGS. 7A through 7D are a top-level flow diagram illustrating a method of refining and implementing a circuit including a parameterizable IC using a framework or environment according to an embodiment of the present disclosure.

An embodiment of a method for refining a circuit comprising a parameterizable IC using the CDT and CTT software will now be described with reference to the top-level flow diagram of FIGS. 7A through 7D. Referring to FIG. 7A, the method begins with reading or receiving user inputs or default settings from a CDT (702). Generally, these inputs or settings include one or more overall candidate circuits, each comprising one or more sub-circuits. For each sub-circuit, these inputs or settings can include sensor report accuracy, sensor report rate, optional power consumption limit, optional ADC capacity percentage limit, sensor operational temperature minimum and maximum, contributions to the degradation of nominal sensor reading accuracy including drift since calibration, digital and analog voltage source tolerances, user-specified operational temperature range, calibration state, and sensor-sub-circuit tolerances. For the overall candidate circuits, these inputs or settings can include one or more candidate parameterizable ICs and its associated ADC characteristics.

Optionally, inputs from the CDT can further include a listing of all major circuit elements of a candidate circuit design, referred to hereinafter as the Major Circuit Elements List (MCEL). The MCEL can include or list one or more sensors, actuators, a number of parameterizable ICs, reference or supply voltages and any of number of discrete, external components needed to couple the candidate-circuit design to sensors and/or actuators and to the host processor or host communication channel. Generally, these circuit elements and components are allocated to one of the following categories: (i) the set of sensors; (ii) the set of actuators; (iii) parameterizable IC; (iv) the set of remaining circuit components such as resistors and voltage references; and (v) the set of digital and analog voltages. Alternatively or additionally, as noted above inputs from the CDT can further include circuit or sub-circuit alternatives, e.g. circuits or sub-circuits using alternative sensors, other components, or other sub-circuit configurations. Alternatively, the CTT can expand the sub-circuit alternatives provided by the CDT.

Next, user inputs are read or received from CTT (704). These input can be entered, for example, through a user input module and can include or specify target characteristics for the overall circuit, any of the sub-circuits or sensors. Optionally, the user inputs can override inputs from the CDT.

An assessment or evaluation is made of a first of a number of candidate sub-circuits (706), by evaluating each candidate sensor for the current sub-circuit candidate (708). Evaluation of a candidate sensor begins with reading or receiving manufacturer-specified characteristics of the current candidate sensor (710). These characteristics of the candidate sensor can include power consumption, a nominal sensor reading accuracy, and the maximum sensor-reading rate at a user-specified operational temperature range. The characteristics can be received directly from a manufacturer-supplied database coupled directly to the CTT, coupled to the CTT through an IP network, or through the CDT. The candidate sensor is evaluated to ascertain whether it meets predetermined specified criteria for the sub-circuit (712). Specified criteria can include, for example, cost, temperature range, power consumption, and/or availability. This initial power consumption check is based on a maximum user specified report rate and an optional minimum sensor sample rate, and on other sub-circuit elements allocated to the sensor-sub-circuit.

If the sensor does not meet any of the specified criteria, it is discarded, and the next candidate sensor for the current sub-circuit is evaluated (714).

If the sensor does meet all or substantially all of the specified criteria, an effective sensor reading accuracy is calculated for without degradation of accuracy from the ADC (716), referred to hereinafter as Aggregate_Accuracy (Ideal ADC). Referring to equations 1 and 2 above, when, for example, m is two, calculate the square root of the sum of the squares of:
  a) accuracy component of the raw sensor reading at its nominal temperature;
  b) accuracy tolerance component of drift since calibration;
  c) accuracy tolerance of the digital and analog voltage sources;
  d) accuracy degradation due to the user-specified operational temperature range; and
  e) accuracy tolerance of the other sensor-sub-circuit elements Results of the above calculations are compared to a user specified accuracy of sensor reports to the host (718). As a value larger than a user specified accuracy of sensor reports to the host represents a less accurate result, if the result of the above calculation is greater than the user specified, the candidate sensor is discarded and the next candidate sensor for the current sub-circuit is evaluated (720).

Figure 7B:
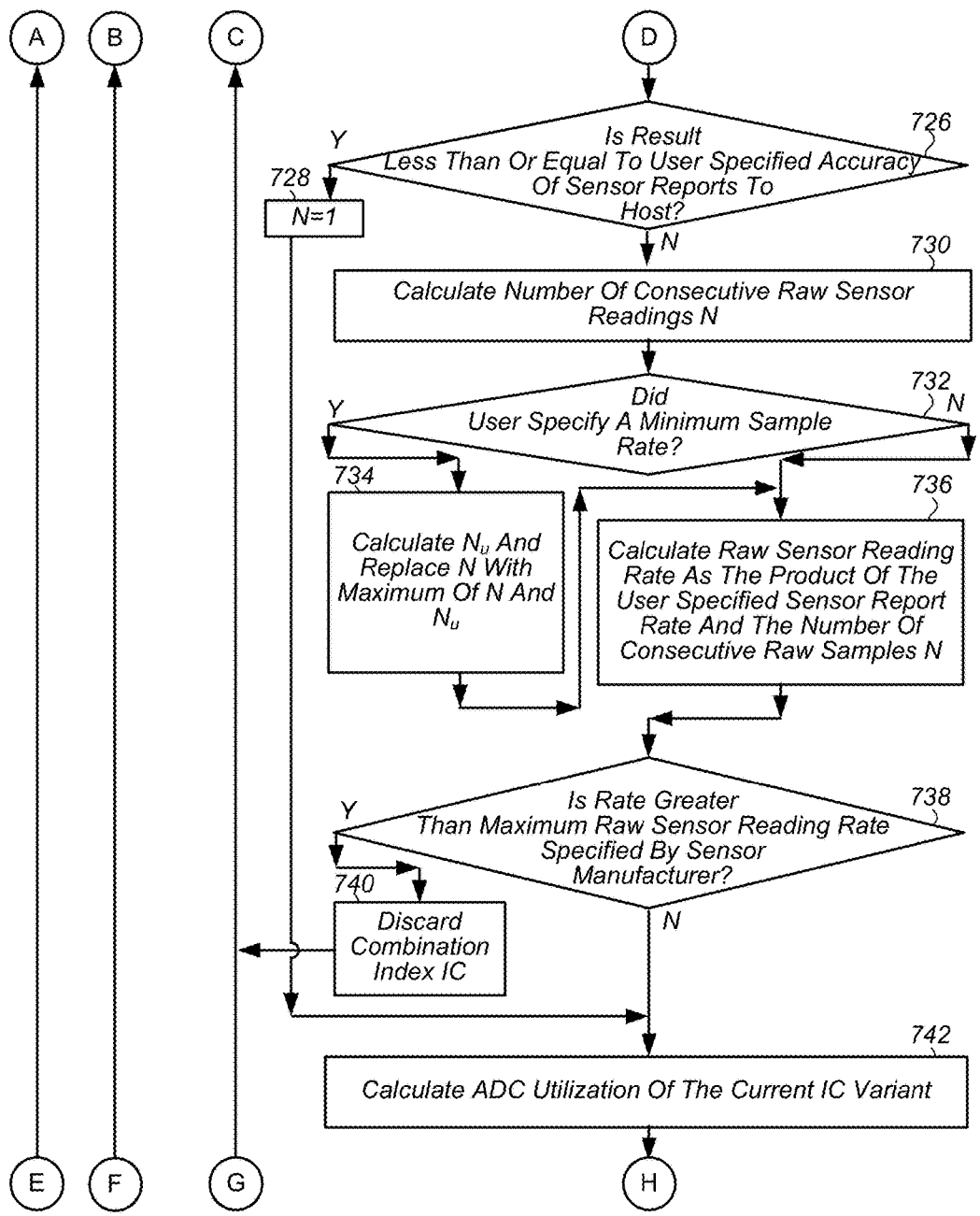

If the result of the above calculations is less than the user specified, an assessment or evaluation is made of a first of a number of candidate configurable ICs (722). Evaluation of a candidate IC begins with calculating an aggregate accuracy of the total effective sensor reading accuracy, including the contribution from one reading of the ADC associated with the current candidate IC (724). Referring to FIG. 7B, the result of this calculation is compared to the user specified accuracy of sensor reports to the host (726). If the result of the calculation is less than or equal to the user specified accuracy of sensor reports to the host, i.e. a more accurate result, then the candidate sensor can be used without combining multiple raw sensor readings (e.g., N=1) (728). Otherwise, the number of consecutive raw sensor readings N combined with a box-car-like filter is calculated that averages the readings and decreases the effective noise at the ADC by the square root of the number of readings combined (730). (See Equation 3 above) For example, if the goal or target sensor report accuracy is 14 bits or $2^{-14}$ or about 0.000061; the square root (RSS) of the accuracy contributions assuming an ideal ADC is 15.6 bits or $2^{-15.6}$ or about 0.000020; and, the ADC accuracy is 12 bits or $2^{-12}$ or about 0.000244, then the resulting number of samples is estimated as: N=Ceiling$(((0.000244)^2)/((0.000061)^2-(0.000020)^2))$ or about 18, assuming quantization noise does not prevent the gain realized from combining multiple samples. Note, that raising the resultant N to some power slightly larger than one can increase this estimate of the number of samples to account for a less ideal noise environment.

Next, a check is performed to determine if the user specified a minimum sample rate (732). If the user specified a minimum sample rate, then the number of samples for the user specified rate (Nu) is calculated, and N is replaced with the maximum of N or Nu (734). (See Equation 4 above) The user can specify the maximum sample rate, for example, to bound or limit a latency of the sensor report to the host. If the user has not specified a minimum sample rate, then the raw sensor-reading rate is calculated as a product of a user specified sensor report rate and the number of consecutive raw samples N (736). The resulting product is compared to a maximum raw sensor-reading rate specified by the sensor manufacturer (738). If the calculated rate is greater than the maximum raw sensor-reading rate, the current combination of sensor and IC are discarded and the next candidate combination for the sensor-sub-circuit is evaluated (740).

Figure 7C:
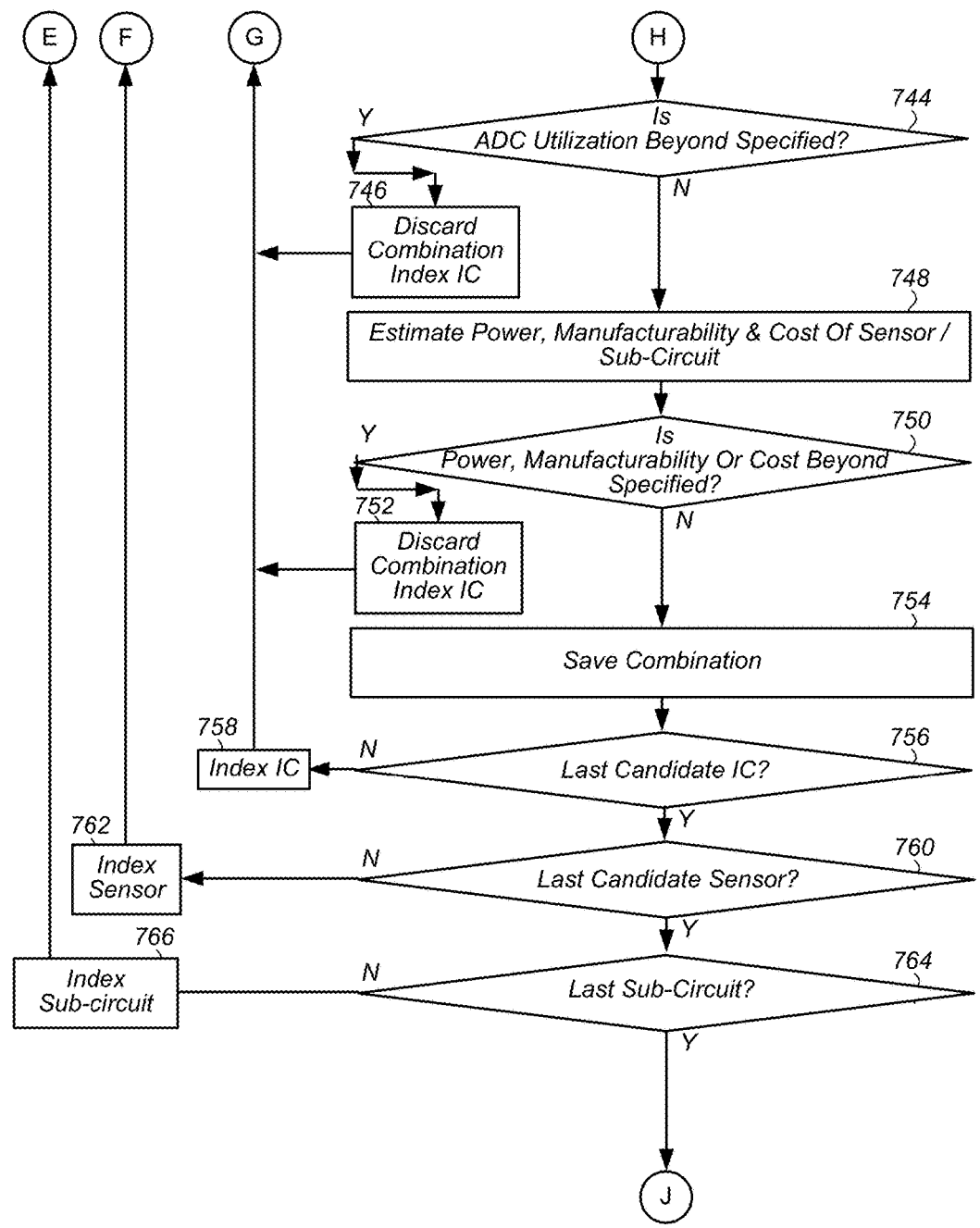

If the calculated rate is less than the maximum raw sensor-reading rate, the ADC utilization of the current IC is calculated based on the raw sensor-reading rate (742). Referring to FIG. 7C, the calculated ADC utilization is compared to an optionally specified ADC utilization (744). If the calculated ADC utilization is beyond the specified ADC utilization, the current combination of sensor and IC is discarded and the next candidate combination for the sensor-sub-circuit is evaluated (746).

If the calculated ADC utilization is less than the specified ADC utilization, power consumption, manufacturability and cost of the sensor and/or sensor-sub-circuit is calculated based on the raw sensor-reading rate (748). The calculated power consumption, manufacturability and cost are compared to an optionally specified power consumption goal, cost goal, and manufacturability goals including part count, number of unique parts, shared power sources and shared voltage or current references (750). If the calculated power consumption, manufacturability or cost is beyond that specified, the current combination of sensor and IC is discarded and the next candidate combination for the sensor-sub-circuit is evaluated (752).

If the power consumption is less than the specified power consumption, the current combination of sensor and IC is saved or recorded for later presentation to the user (754), and a check performed to determine if the current IC is the last candidate IC for the sensor-sub-circuit (756). If the current IC is not the last candidate IC, the current candidate IC is indexed (758) and the next candidate IC for the sensor-sub-circuit is evaluated.

Next, a check is performed to determine if the current sensor is the last candidate sensor for the sub-circuit (760). If the current sensor is not the last candidate sensor, the current candidate sensor is indexed (762) and the next candidate sensor for the sub-circuit is evaluated.

A check is performed to determine if the current sub-circuit is the last sub-circuit for the overall circuit (764). If the current sub-circuit is not the last sub-circuit, the current sub-circuit is indexed (766) and the next sub-circuit is evaluated.

Figure 7D:
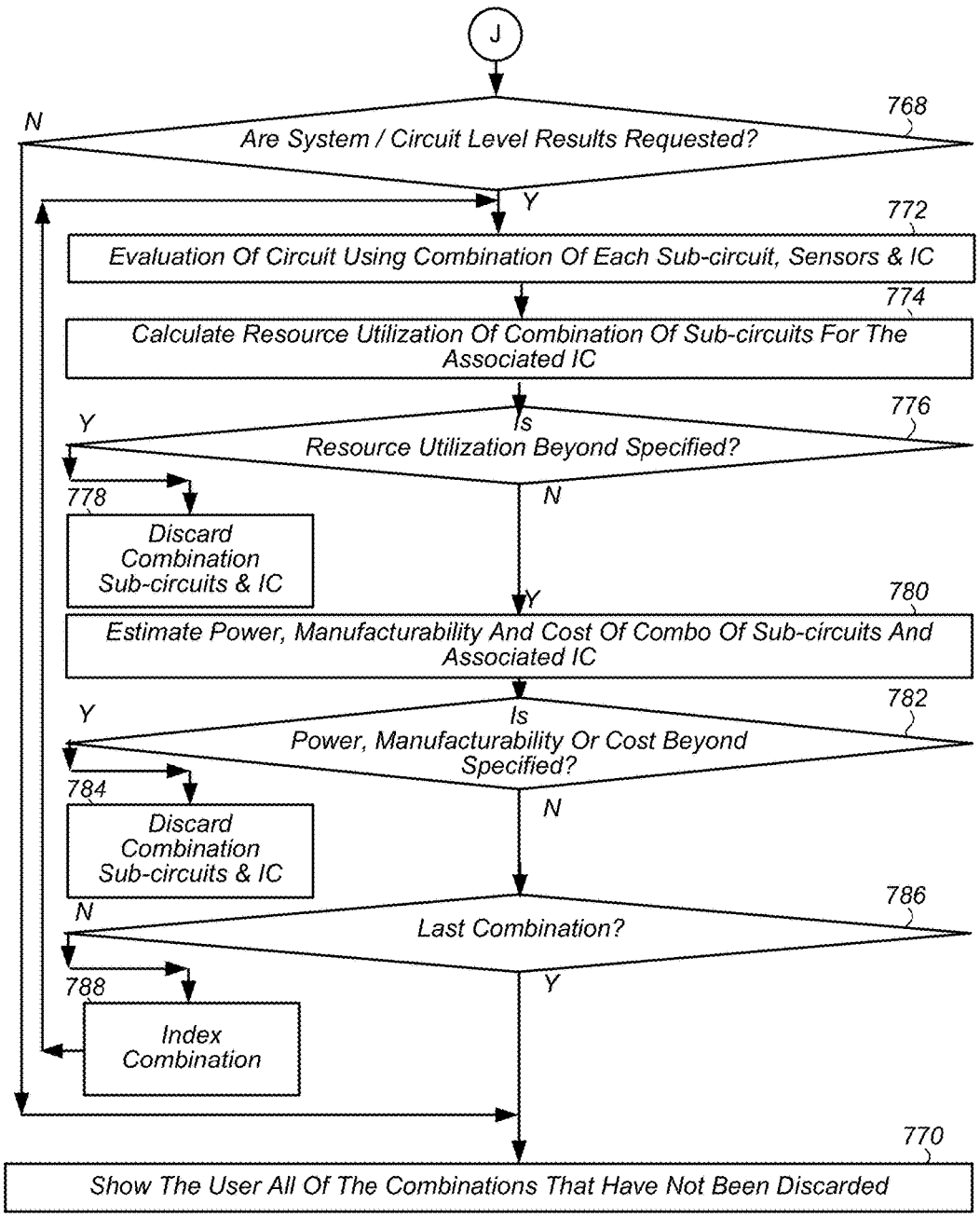

Referring to FIG. 7D, after all sub-circuits have been evaluated, a check is performed to determine if system or overall circuit level results have been requested (768). If system or overall circuit level results have not been requested, an output module shows the sub-circuit combinations that have not been discarded (770).

If system level results are requested, the method continues with evaluation of the overall circuit, including combinations of each sub-circuit with the same associated IC (772). It is noted that there may be many such possible combinations of sub-circuits, sensors and the associated ICs. In one alternative embodiment, the method may further include a step in which the CTT automatically selects only the combinations with the more desirable characteristics so the user gets an answer more quickly (and with fewer alternate combinations that are likely less desirable). The resource utilization of the overall circuit, including combination of all sub-circuits and the associated IC is calculated based on the raw sensor-reading rate of each sensor (774). As noted above, by resource utilization it is meant the usage by the sensor of parametric analog and digital circuit elements, such as an ADC, in the sub-circuit and/or the complete circuit, both internal and external to the candidate parameterizable IC. The calculated resource utilization is compared to an optionally specified resource utilization (776). If the resource utilization is beyond the optional specified amount or is greater than 100%, the current combination of sensors, sub-circuits, and IC is discarded (778).

If the calculated resource utilization is not beyond the specified resource utilization and/or is less than 100%, the power consumption, manufacturability and cost of the overall circuit, including combination of all sub-circuits and the associated IC is calculated with the power based on the raw sensor-reading rate of each sensor (780). The calculated power consumption, manufacturability and cost are compared to an optionally specified power consumption goal, cost goal, and manufacturability goals including part count, number of unique parts, shared power sources and shared voltage or current references (782). If the power consumption, manufacturability or cost is beyond the optional specified amount or is greater than 100%, the current combination of sensors, sub-circuits, and IC is discarded (784).

If the power consumption is less than the specified power consumption, a check is performed to determine if the current combination of sub-circuits is the last combination (786). If the current combination is not the last combination, the current combination is indexed (788) and the next combination is evaluated. After all combinations of sub-circuits have been evaluated, the output module shows the user all circuit and sub-circuit combinations that have not been discarded (770).

It will be understood the above-described method is simplified for clarity and the method can include any number of additional steps or sub-steps without departing from the spirit and scope of the present invention. For example, the method can further include reporting candidate-circuits not meeting target values but within a specified amount or percentage of the target values with the results annotated accordingly. Additionally or alternatively, the method can further include steps for altering modes of operation of the candidate circuit or scheduling sampling of an analog-to-digital conversion to meet target values.

For example, in one embodiment the method can further include calculating alternate parameterization or configuration settings to enable the parameterizable IC to switch between different operating modes based on a timer, a sensed condition, and/or a mode change command received from the host system to reduce power consumption or increase a sensor-sampling rate.

In another embodiment, the method can further include fixing one or more sub-circuits of a completed or substantially completed design while iterating refinement of one or more other sub-circuits using the CTT to meet additional or revised target values the circuit. For example, the CTT can iterate one or more sensor or actuator sub-circuits while fixing the design and parameterization of the remaining sub-circuits to improve performance, reduce cost or increase manufacturability of the overall circuit. The iteration can be either to degrade or to enhance performance of the one or more of the non-fixed sensor or actuator sub-circuits.

Exemplary, user interface pages for a circuit refined using tools and method according to an embodiment of the present disclosure will now be described with reference to FIGS. 8A and 8B. In particular, FIG. 8A illustrates a user interface page for a one sensor-sub-circuit refined using a CTT and method according to an embodiment of the present disclosure, and FIG. 8B illustrates a user interface page for a circuit comprising multiple sensor-sub-circuits refined using a CTT and method according to an embodiment of the present disclosure.

Referring to FIG. 8A, it is seen that the user interface (UI) page includes a number of sensor characteristics for a number of candidate sensors including accuracy, rate, power, sense range, temperature, cost, availability, calibrations, digital and analog voltages, manufacturers and distributors. Sensor characteristics under calibration can indicate whether the sensor includes gain-set resistors, which substantially eliminate the need for full-scale calibration. The UI page further includes a number of slider widgets to enable the user to scroll through all candidate sensors, and nudge the user specified measurement accuracy and nudge the user specified measurement report rate. These adjustments to measurement accuracy and report rate enable the user to consider alternative measurement specifications without going all the way back to the CDT. In addition, the UI page can include a number of fields to enable the user to input target values such as minimum and maximum temperature goals and/or check boxes to the right side of the figure to include or exclude the power and cost related to the sensor-sub-circuit beyond the sensor itself. For example, the check box can instruct the CTT to consider the sensor only instead of the entire sensor-sub-circuit for characteristics like cost and power consumption. Optionally, the fields of the candidate sensors can be ordered, shaded, or colored to indicate a priority or preference in candidates based on a previously entered weighted list of target-circuit characteristics. These priorities and/or preferences are used to calculate the columns (of sensors) in the table so that the candidate sensors for the current sub-circuit are ordered from most desirable to least desirable from say left to right.

FIG. 8B includes many of the same fields as FIG. 8A, with the difference that the columns are for the current selected or preferred sensor-sub-circuits that form the complete circuit rather than the candidates for one sub-circuit. In addition, FIG. 8B preferably further includes fields providing information on the total system or overall circuit design such as total power and cost.

Primary trade-offs and/or optimized characteristics for the circuit likely to be important to the user include: sensors and actuators selected for circuit; accuracy of results reported from each sensor to the host; power consumption for the circuit and also attributable to each sensor; rate of sensor reports from each sensor to the host; operational temperature range; cost for the circuit and also attributable to each sensor; heat dissipation; failure rate; common failure types; and mass. In addition, there are secondary characteristics for the circuit, the sensor-sub-circuit, or the individual circuit elements that may be important or of interest to the user. These include: availability of each circuit element on the MCEL; list of calibration measurement opportunities for each sensor and/or actuator and its sub-circuit; list of digital and analog voltage sources attributable to each sensor; list of manufacturers and distributors for each element; maximum or typical latency for sensor reports to the host; storage temperature range; and the storage and/or operating environmental conditions and/or requirements. The above list is referred to hereinafter as the Trade-offs and Optimized Characteristics List TOCL.

Tradeoffs to Reduce Power Consumption

Opportunities or steps to reduce power consumption, and resultant heat generation for the completed circuit, using the circuit tradeoff tool generally include: operating sensor or signal acquisition chains or paths at or near a minimum supply voltage; use lower bias currents in programmable gain amplifiers (PGAs) and analog-to-digital converters (ADCs); disable PGAs and couple input signals from sensors directly to the ADC; operate the ADC at a high, efficient sample rate and maximize the power down time of the PGAs and ADCs between samples; and switch off at least some signal paths in the circuit between a top-level operating mode and an idle or standby mode.

Several of the above opportunities or steps will now be described in more detail. It will be understood that the first and simplest step to reduce power consumption is to operate sensor or signal acquisition paths at or near a minimum supply voltage for which the sensor can reliably and accurately operate. Information on the minimum supply voltage can be obtained from manufacturer databases and accessed through the CDT. Similarly, it will be further understood power consumption can be further reduced by lowering bias currents in PGAs and ADCs. If desired, greater offset and gain adjustment can be used after the analog signal is sampled to compensate for the lower bias current.

Finally, as noted above, the parameterizable IC can include multiple registers to hold alternate configuration settings calculated by the CDT or CTT during circuit design or optimization to support switching all or part of the circuit between different operating modes. When the circuit is not in an active operating mode, power to some or substantially the entire major the circuit elements can be turned off or reduced to place the circuit in a lower power consuming stand-by mode. The opportunity to turn off or use a stand-by mode for each of the circuit elements depends on the set of circuit elements selected and the duty cycle of their use. For particularly power-conscious solutions, there may be more than one operating mode and/or one stand-by mode available depending on the sensor-reading rates, the available calibration measurements, and the operating temperature range. For example, circuit elements in a sensor path monitoring a critical temperature may be operated either in a normal, full operating mode or in one of several reduced power operating modes, each with successively lower sampling frequency. At the same time another sensor path monitoring a less critical parameter, such as a half-full tank level, may be switched between a single operating mode and a standby mode.

The circuit or signal path can switch between these alternate operation modes based on a timer, a sensed condition, and/or a mode change command received from the host system. Even so, it is likely that the operating modes are selected so that all of the enabled sensor measurements are reported to the host at the same rate.

The sensor raw reading rates can be different from the sensor report rates to the host since multiple sensor readings can be processed before reporting the effective measurement to the host. In addition, some of the sensor report rates can be zero depending on the needs of the top-level operating mode. This top-level operating mode can be simplified to the level of an individual sensor by ignoring the other sensors and their sub-circuits except for the allocation by the CDT of the non-sensor circuit elements to the sensor of interest. Accounting for this allocation enables calculations of power consumption or cost attributable to each of the user-specified sensor measurements.

Figure 9:
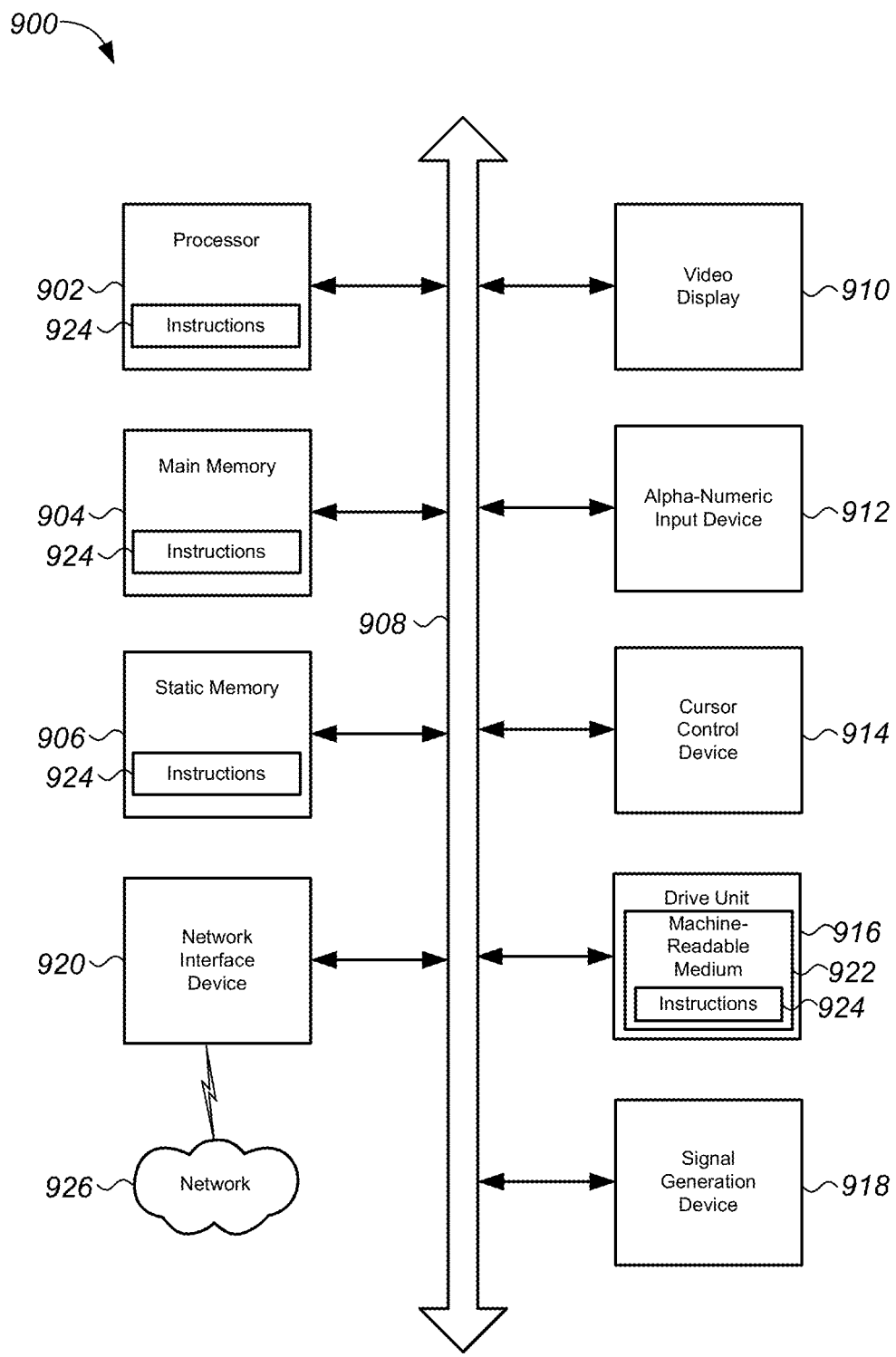
FIG. 9 illustrates a diagrammatic representation of a machine in the example form of a computer system within which a set of instructions, for causing the machine to perform any one or more of the methodologies, processes, or operations discussed herein, may be executed.

FIG. 9 shows a diagrammatic representation of a machine in the form of a computer system 900 within which a set of instructions, for causing the machine to perform any one or more of the methodologies, processes, or operations discussed herein, may be executed. In some embodiments, a computer system 900 may be used for sensing movement of an actuator across a surface of a window in an enclosure of an interface device.

The computer can operate as a standalone device or, in alternative embodiments, may be connected (e.g., networked) to other computers. In a networked deployment, the computer may operate in the capacity of a server or a client computer in server-client network environment, or as a peer computer in a peer-to-peer (or distributed) network environment. The computer may be a server computer, a client computer, a personal computer (PC), a tablet PC, a set-top box (STB), a Personal Digital Assistant (PDA), a cellular telephone, a web appliance, a network router, switch or bridge, or any computer capable of executing a set of instructions (sequential or otherwise) that specify actions to be taken by that computer. Further, while only a single computer is illustrated, the term "computer" shall also be taken to include any collection of machines that individually or jointly execute a set (or multiple sets) of instructions to perform any one or more of the methodologies discussed herein.

The example computer system 900 includes a processor 902 (e.g., a central processing unit (CPU) a graphics processing unit (GPU) or both), a main memory 904 and a static memory 906, which communicate with each other via a bus 908. The computer system 900 may further include a video display unit 910 (e.g., a liquid crystal display (LCD) or a cathode ray tube (CRT)). The computer system 900 also includes an alphanumeric input device 912 (e.g., a keyboard), a cursor control device 914 (e.g., an interface device), a disk drive unit 916, a signal generation device 918 (e.g., a speaker) and a network interface device 920.

The disk drive unit 916 includes a machine or computer-readable medium 922 on which is stored one or more sets of instructions (e.g., software 924) embodying any one or more of the methodologies or functions described herein. The software 924 may also reside, completely or at least partially, within the main memory 904 and/or within the processor 902 during execution thereof by the computer system 900, the main memory 904 and the processor 902 also constituting computer-readable media.

The software 924 may further be transmitted or received over a network 926 via the network interface device 920.

While the computer-readable medium 922 is shown in an example embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the present invention. The term "computer-readable medium" shall accordingly be taken to include, but not be limited to, solid-state memories, optical and magnetic media, and carrier wave signals.

Thus, embodiments of circuit trade-off tools and methods for using the same to optimize a circuit including a parameterizable IC have been described. Although the present disclosure has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract of the Disclosure has been provided to comply with 37 C.F.R. §1.72(b), requiring an abstract that will allow the reader to quickly ascertain the nature of the technical disclosure. It may be submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure may be not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the control system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

What is claimed is:

1. A parameterizable Integrated Circuit (IC) comprising:
   a number of parametric sensing signal chains, each including analog and digital circuit elements;
   a number of input pins to the sensing signal chains, each of the input pins electrically coupled to one or more external sensing elements for measurement of physical properties for which sensing elements exist; and
   a scheduler to schedule and allocate the analog and digital circuit elements to each of the parametric sensing signal chains, based on measurement priorities, and measurement rates,
   wherein the scheduler operates autonomously to implement changes in a time for which the analog and digital circuit elements are allocated to each of the parametric sensing signal chains based on a result of the measurement of physical properties.

2. The parameterizable IC according to claim 1, wherein the scheduler implements changes the time based on user specified targets in measurement rate or accuracy.

3. The parameterizable IC according to claim 1, wherein the one or more external sensing elements comprise sensors to sense pressure, temperature, weight, humidity, air-flow, acceleration, tilt, rotation, position, light, gas, liquid-level, touch and proximity sensing.

4. The parameterizable IC according to claim 1, wherein the analog and digital circuits elements comprise one or more analog multiplexers, analog gain blocks, analog common mode shifting blocks, analog and digital noise suppression blocks, analog-to-digital converters, digital averaging and filtering circuits, gain adjustment circuits, linearity adjustment circuits and temperature compensation circuits.

5. The parameterizable IC according to claim 1, wherein the number of parametric sensing signal chains include at least two parametric sensing signal chains that share at least one analog or digital circuit element.

6. The parameterizable IC according to claim 5, wherein the at least one analog or digital circuit element comprises an analog-to-digital converter, and wherein the scheduler operates autonomously to change the time or order in which the analog-to-digital converter is allocated to the two of the plurality parametric sensing signal chains.

7. A parameterizable Integrated Circuit (IC) comprising:
   resources including analog and digital elements and sub-circuits;
   a plurality of parametric sensing signal chains, each including a number of the resources, and wherein at least two of the plurality parametric sensing signal chains share at least one resource;
   a number of input pins each electrically coupled to an external sensing element for sensing physical properties external to the parameterizable IC, and to the plurality of parametric sensing signal chains to provide signals from said external sensing element to the parametric sensing signal chains for measurement of said physical properties; and
   a scheduler to schedule and allocate resources to each of the parametric sensing signal chains,
   wherein the scheduler operates autonomously to schedule and allocate resources to each of the parametric sensing signal chains at repeated time intervals, and to implement changes in a time or order of the allocation of resources based on user specified targets, a result of the measurement of physical properties and the analog and digital elements and sub-circuits available.

8. The parameterizable IC according to claim 7, wherein the user specified targets include measurement rate and measurement accuracy.

9. The parameterizable IC according to claim 7, wherein the external sensing element comprises a sensor to sense pressure, temperature, weight, humidity, air-flow, acceleration, tilt, rotation, position, light, gas, liquid-level, touch or proximity sensing.

10. The parameterizable IC according to claim 7, wherein the resources comprise one or more analog multiplexers, analog gain blocks, analog common mode shifting blocks, analog and digital noise suppression blocks, analog-to-digital converters, digital averaging and filtering circuits, gain adjustment circuits, linearity adjustment circuits and temperature compensation circuits.

11. The parameterizable IC according to claim 7, wherein the at least one resource shared by at least two of the plurality parametric sensing signal chains comprises an analog-to-digital converter, and wherein the scheduler operates autonomously to change the time or order in which the analog-to-digital converter is allocated to the two of the plurality parametric sensing signal chains.

12. A parameterizable-Integrated Circuit (IC) comprising:
   parametric sensing signal chains, each including a number of analog and digital circuit elements, and at least two parametric sensing signal chains sharing at least one of the number of analog and digital circuit elements;
   input pins each electrically coupled to an external sensing element for sensing physical properties external to the parameterizable IC, and to the parametric sensing signal chains to provide signals for measurement of said physical properties to the parametric sensing signal chains; and
   a scheduler to schedule and allocate the number of analog and digital circuit elements to each of the parametric sensing signal chains,
   wherein the scheduler operates autonomously to implement changes in a time for which the number of analog and digital circuit elements are allocated to each of the parametric sensing signal chains based on a result of the measurement of said physical properties.

13. The parameterizable IC according to claim 12, wherein the at least one analog or digital circuit element shared by the two parametric sensing signal chains comprises an analog-to-digital converter, and wherein the scheduler operates autonomously to change in the time or order in which the analog-to-digital converter is allocated to the two parametric sensing signal chains.

14. The parameterizable IC according to claim 13, wherein the analog and digital circuits elements comprise one or more analog multiplexers, analog gain blocks, analog common mode shifting blocks, analog and digital noise suppression blocks, analog-to-digital converters, digital averaging and filtering circuits, gain adjustment circuits, linearity adjustment circuits and temperature compensation circuits.

15. The parameterizable IC according to claim 12, wherein the external sensing element comprises a sensor to sense pressure, temperature, weight, humidity, air-flow, acceleration, tilt, rotation, position, light, gas, liquid-level, touch or proximity sensing.

* * * * *